United States Patent [19]

Rast

[11] 4,109,283

[45] Aug. 22, 1978

[54] FREQUENCY COUNTER FOR A TELEVISION TUNING SYSTEM

[75] Inventor: Robert Morgan Rast, Mercerville, N.J.

[73] Assignee: RCA Corporation, New York, N.Y.

[21] Appl. No.: 688,588

[22] Filed: May 21, 1976

[51] Int. Cl.² .................. H04N 5/44; H04N 5/50; H04B 1/16; H04B 1/32
[52] U.S. Cl. .................. 358/191; 358/193; 358/195; 325/419; 325/470
[58] Field of Search .................. 325/418–423, 325/453, 457, 464, 468–470; 358/191, 193, 195; 334/16; 331/10, 17, 1 A

[56] References Cited

U.S. PATENT DOCUMENTS

| | | | |
|---|---|---|---|
| 3,931,579 | 1/1976 | Ma et al. | 325/464 |
| 3,962,640 | 6/1976 | Bomba | 325/470 X |
| 3,968,444 | 7/1976 | Tenny | 325/453 X |
| 4,009,439 | 2/1977 | Rast | 325/457 X |
| 4,024,476 | 5/1977 | Briggs | 375/421 |
| 4,031,549 | 6/1977 | Rast et al. | 325/419 X |

Primary Examiner—John C. Martin
Assistant Examiner—Aristotelis M. Psitos
Attorney, Agent, or Firm—Eugene M. Whitacre; Kenneth R. Schaefer; Peter M. Emanuel

[57] ABSTRACT

A tuning system for a television receiver includes a local oscillator which is controlled first by a phase lock loop arrangement and then by an AFT discriminator arrangement for tuning the receiver to non-standard as well as standard frequency carriers. The phase lock loop arrangement includes a programmable divider for dividing the local oscillator frequency by a programmable factor corresponding to the presently selected channel. When the local oscillator is being controlled by the AFT discriminator arrangement, the count accumulated by the programmable divider during a reference interval determines how far the local oscillator frequency has drifted from its nominal value. If a predetermined frequency offset has been exceeded, control is returned to phase lock loop control and the programmable factor is incrementally changed.

13 Claims, 12 Drawing Figures

FREQUENCY COUNTER FOR A TELEVISION TUNING SYSTEM

The present invention pertains to television tuning systems including a phase locked loop frequency synthesizer and particularly pertains to frequency counters which may be utilized in such systems.

In concurrently filed U.S. patent application Ser. No. 70,849, and now U.S. Pat. No. 4,031,549 by Henderson et al., assigned to the same assignee as the present invention, there is described a tuning device system for a television receiver which includes a phase locked loop for tuning a local oscillator to the nominal local oscillator frequencies required to tune the receiver to RF carriers at standard broadcast frequencies allocated to the various channels a viewer may select. The tuning system also includes an automatic fine tuning (AFT) frequency discriminator for tuning the local oscillator to minimize any deviation between the frequency of an actual picture carrier and the nominal picture carrier frequency. If the receiver is coupled to a television distribution system which provides RF carriers having nonstandard frequencies arbitrarily near respective ones of the standard broadcast frequencies, when the phase locked loop has achieved lock at a nominal frequency, a mode control unit selectively couples the discriminator and a frequency drift control circuit to the local oscillator. If the frequency of the local oscillator drifts more than a predetermined offset from the frequency synthesized under phase locked loop control because no carrier has been detected by the discriminator, discriminator and drift control are terminated so that the receiver will not be tuned to an undesired carrier such as, for example, the lower adjacent channel sound carrier, and phase locked loop control is reinitiated to synthesize a local oscillator signal having a frequency incremented from the frequency of the originally synthesized local oscillator signal by a predetermined amount. After the phase locked loop is locked at an incremented frequency, discriminator control is again initiated. If, during this cycle of discriminator control, the local oscillator again drifts more than the predetermined offset from the incremented local oscillator frequency because no carrier is detected by the discriminator, phase locked loop control is again reinitiated to synthesize a local oscillator signal having a frequency decremented from the frequency of the originally synthesized local oscillator signal by a predetermined amount. If during any discriminator control cycle the local oscillator has not drifted further than the predetermined offset because the discriminator has tuned the local oscillator to a carrier within the predetermined offset, phase locked loop control is not reinitiated and the tuning sequence is complete.

In order to reduce the complexity, and therefore the cost, of an implementation of such a tuning system, it is desirable that individual potions of the system be capable of performing more than one function. For example, in copending United States Patent Application Ser. No. 663,097 filed for R. M. Rast on Feb. 27, 1976, and now U.S. Pat. No. 4,009,439 and assigned to the same assignee as the present invention, which is hereby incorporated by reference, there is described a frequency divider for a television tuning phase locked loop tuning system. For each channel a viewer selects, the divider divides the frequency of the local oscillator signal by a number proportional to the nominal local oscillator frequency by forming a signal including first and second portions having durations respectively equal to first and second numbers of periods of the local oscillator signal. The first number is related to the selected channel number. The second number is related to the frequency band in which the selected channel resides. To generate signals including in which band the selected channel resides for use in the phase locked loop itself and in the local oscillator to control its frequency range, a band selection unit is included as an integral part of the divider.

In accordance with the present invention, a programmable counter which may be used, for example, in a phase locked loop portion of a tuning system of the type decribed in the concurrently filed Henderson et al. application referenced above to divide the frequency of the local oscillator by a number proportional to the nominal local oscillator frequency for a selected channel is arranged so that it may also serve to generate a signal indicating whether or not the frequency of the local oscillator has drifted beyond a predetermined frequency offset after phase locked loop control of the local oscillator has been terminated. When the local oscillator is under phase locked loop control, the programmable counter accumulates a nominal number of counts during a predetermined portion of its output signal. Means are provided for generating a count signal after phase locked loop control of the local oscillator has been terminated. The count signal has a duration with a predetermined time relationship to a reference signal to which the local oscillator signal is locked when the local oscillator is under phase locked loop control. The counter is disabled from counting when the local oscillator is not under phase locked loop control except during the duration of the count signal. Offset detection means, in response to the count signal, generates an offset signal representing the deviation between the count accumulated during a time interval corresponding to the predetermined portion after phase locked loop control of the local oscillator has been terminated to determine how far the frequency of the local oscillator has drifted from the frequency synthesized under phase locked loop control.

These and other features of the present tuning system will best be understood by reference to the following detailed description and accompanying drawings in which.

Figure 1:
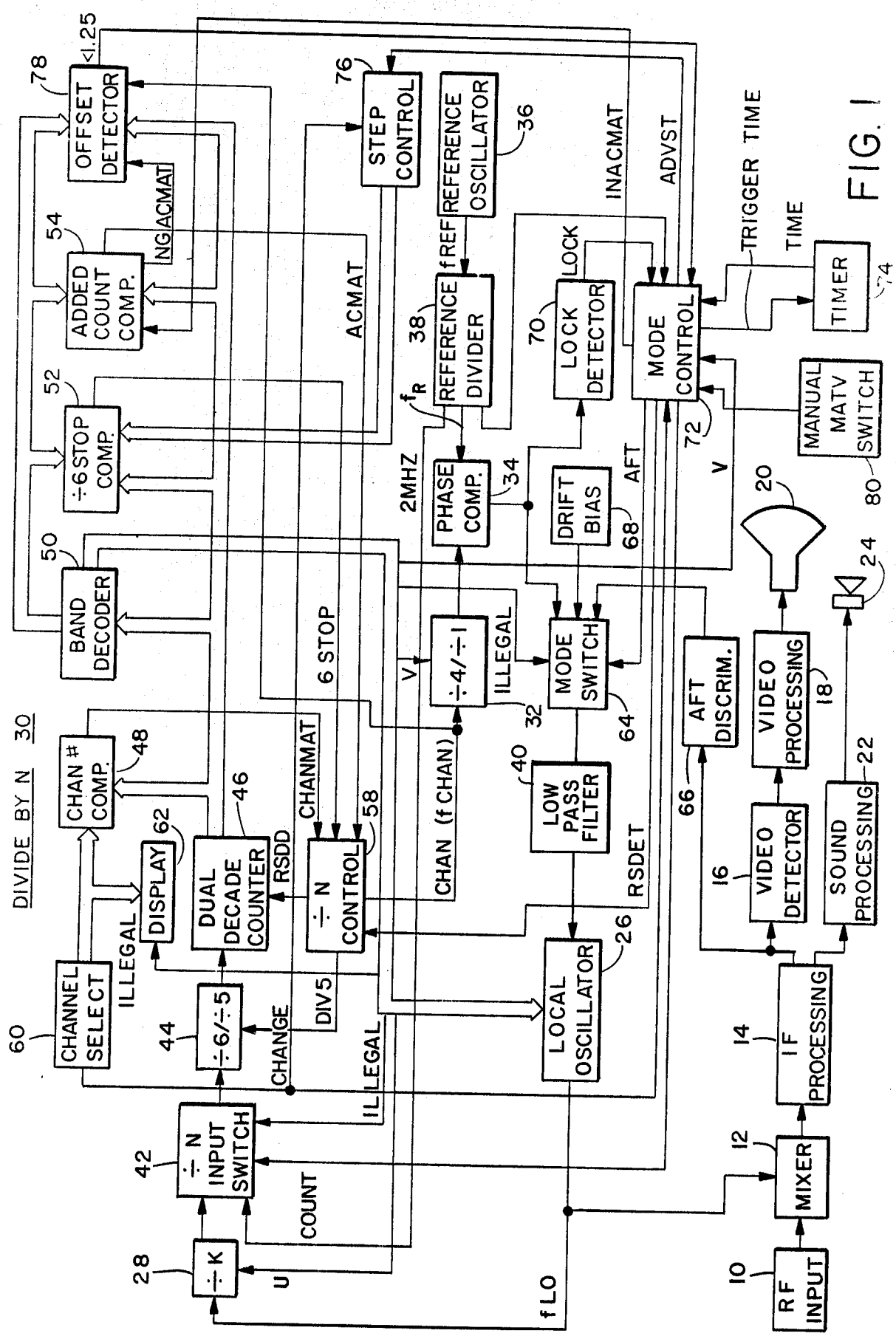
FIG. 1 shows a block diagram of a television receiver employing the present tuning system.

In the television receiver of FIG. 1, television signals are received by an RF input unit 10. RF input unit 10 may comprise an antenna for receiving television signals having modulated radio frequency (RF) carriers at standard broadcast frequencies allocated to the various channels a viewer may select. Alternately, RF input unit 10 may comprise a system in which television signals having modulated RF carriers at standard frequencies are received and frequency translated so as to provide television signals having modulated carriers at nonstandard frequencies arbitrarily near respective ones of the standard frequencies. For example, RF input unit 10 may comprise a master antenna television (MATV) distribution system in which television signals having standard frequency RF carriers are received by a master antenna and distributed through cables to the various units of a motel or apartment complex as television signals having non-standard frequency carries as far as ±2 MHz from respective ones of the standard frequency carriers.

RF carriers provided by RF input unit 10 are coupled to a mixer 12 where they are combined with local oscillator signals generated by a local oscillator 26 to form intermediate frequency (IF) signals including picture, color and sound carriers. The IF signals are coupled to a IF processing unit 14 where they are filtered and amplified. The signals processed by IF processing unit 14 are coupled to a video decector 16 which derives luminance, chrominance and synchronization signals from them. A video processing unit 18 processes the chrominamce, luminance and synchronization signals to form an image on kinescope 20. A second processing unit 22 is coupled to IF processing unit 14 to derive sound signals which are in turn coupled to a speaker 24 from the intermediate frequency signals.

Portions of the receiver of FIG. 1 thus far described may, for example, be similar to portions of the receiver described in the "RCA Television Service Data, File 1975 C-5" for the RCA CTC-74 television receiver published by the RCA Corporation, Indianapolis, Ind.

The tuning system of the receiver shown in FIG. 1 is of the type described in detail in the aforementioned Henderson et al. application, hereby incorporated by reference, includes a phase locked loop configuration for synthesizing local oscillator signals having nominal frequencies appropriate for receiving the standard frequency broadcast carriers allocated to the various channels a viewer may select. When RF input system provides standard frequency carriers, mixer 12 combines them with respective ones of the nominal frequency local oscillator signals to form intermediate frequency signal having a picture carrier at a frequency substantially equal to the nominal IF picture carrier frequency, e.g., in the United States, 45.75 MHz. The phase locked loop configuration includes a local oscillator 26, a divide by K prescaler 28, a divide by N input switch 42, a divide by N unit 30, a divide by 4/divide by 1 divider 32, a phase comparator 34, a reference oscillator 36, a reference divider 38 and a low pass filter 40 and a mode switch 64.

The loop just described is arranged so that low pass filter 40 couples a DC voltage to local oscillator 26 which tends to minimize the frequency and phase difference between the output signals of divide by 4/divide by 1 divider 32 and reference oscillator 38. When these two signals are equal in frequency, the frequency of the local oscillator, $f_{LO}$, is given by the expression:

$$f_{LO} = (NKM/R)f_{REF} \quad (1)$$

where $f_{REF}$ is the frequency of the output signal of reference oscillator 36, K is the factor by which prescaler 28 divides (256 for UHF channels and 64 for VHF channels), N is the frequency in megahertz of the desired local oscillator signal, M is the factor by which the divide by 4/divide by 1 divider 32 divides (1 for UHF channels and 4 for VHF channels) and R is the factor by which reference divider 38 divides. From expression (1) it can be seen that if frequency, $f_{REF}$, of the output signal reference oscillator 36 is 4 MHz and reference divider 38 divides the 4 MHz signal by R=1024 (a division factor readily obtainable with a binary counter) to provide a reference frequency equal to 3.90625 kHz, all the nominal local oscillators frequencies for the various channels in the United States may be synthesized.

The local oscillator frequencies synthesized by the phase locked loop configuration just described, when combined with standard frequency carriers in mixer 12, form IF signals having a picture carrier at the nominal IF picture carrier frequency, i.e., in the United States, for example, at 45.75 MHz. However, if the RF carriers provided by RF input 10 are not at standard frequencies, the IF signal will have a picture carrier at frequency spaced from the nominal picture carrier frequency by an amount corresponding to the frequency deviation between the standard RF carrier frequency and nonstandard RF carrier frequency received for the particular channel selected. Therefore, to accommodate the tuning of nonstandard frequency carriers, the tuning system of FIG. 1 includes an automatic fine tuning (AFT) frequency discriminator 66 and a drift bias unit 68 which are selectively coupled by mode switch 64 to low pass filter 40 in response to signals generated by a mode control unit 72, a lock detector 70, a timer unit 74, an offset detector 78 and a step control unit 76 provided in association with AFT discriminator 66 in accordance with a predetermined tuning algorithm graphically illustrated in flow chart form in FIG. 2.

As will be clear from the following description, the nonstandard frequency tuning of the present tuning system will operate to tune the receiver to standard as well as nonstandard carriers. Nevertheless, a manual MATV switch 80 is coupled to mode control unit 72 so that when a viewer knows he is receiving only standard frequency RF carriers, he may manually disable the nonstandard frequency tuning portion of the tuning system. In the following description it is assumed that the non-standard frequency tuning portion of the tuning system has been enabled.

When a viewer selects a new channel by means of channel selection unit 60, channel selection unit 60 generates a CHANGE binary signal to reset the tuning system. The phase locked loop thereafter synthesizes the nominal local oscillator frequency for the selected channel. Lock detector 70 is coupled to phase comparator 34 to determine when the frequency of the output signal of divide by 4/divide by 1 divider 32 is within a predetermined phase and/or frequency deviation from the output signal of reference divider 38 and in this manner determine when the phase locked loop is locked. When the phase locked loop is locked, mode control unit 72 generates an AFT binary signal to cause mode switch 64 to decouple the output of the phase locked loop, i.e., the output of phase comparator 34 from low pass filter 40 and to couple the output of discriminator 66 to low pass filter 40 instead.

AFT discriminator 66 provides an error voltage representative of the deviation between the frequency of an actual picture carrier and the nominal picture carrier freqency to control the frequency of local oscillator 26 so that the deviation is reduced. AFT discriminator 66 may comprise, for example, the type of AFT frequency discriminator utilized in the color receiver described in the RCA Service Data referenced above which provides an S-shaped error voltage versus frequency deviation characteristic over a predetermined frequency control range. Although the frequency control range of commonly used AFT discriminators are typically specified to be ±1 MHz of the nominal picture carrier frequency, e.g., in the United States, 45.75 MHz, they in fact frequently are able to pull in and lock on to a carrier separated from the nominal carrier frequency by as much as 2 or even 3 MHz. Therefore, it is quite conceivable that AFT discriminator 66 could minimize deviations between the frequency of a picture carrier and 45.75 MHz as large as ±2 MHz due to a corresponding frequency deviation between a non-standard frequency carrier, provided, for example, by an MATV distribution system, and its associated standard frequency carrier.

Unfortunately, AFT discriminator 66 may be able to pull in undesirable carriers such as the sound carrier of the next lower channel (i.e., the lower adjacent channel sound carrier) which for example, in the United States is only 1.5 MHz above (in the IF range) the picture carrier of the selected channel. Under some conditions, it may even be possible for discriminator 66 to pull in the sound carrier of the selected channel (i.e., the co-channel sound carrier) which is 4.5 MHz below the picture carrier of the selected channel (in the IF range). It is noted that the ability of an AFT discriminator to pull in undesirable carriers is inhibited in conventional varactor television tuning systems by the IF filter traps and because a DC reference voltage corresponding to the selected channels is added to the error voltage provided by the discriminator and, in essence, limits its pull in range.

In the present tuning apparatus, in order to inhibit the ability of AFT discriminator 66 to pull in undesirable carriers, offset detector 78 is provided to determine if the frequency of local oscillator 26 has drifted further than a predetermined offset from its frequency originally synthesized under phase locked loop control. For the particular tuning arrangement described, the offset is desirably selected as 1.25 MHz because it is less than the nearest undesirable carrier, i.e., the lower adjacent sound carrier which is 1.5 MHz below the picture carrier of the selected channel, and slightly greater than the specified pull-in range of AFT discriminator 66, i.e., ±1 MHz, so as to allow a margin for overshooting the picture carrier to be pulled in. Furthermore, as will be seen, a frequency offset of 1.25 MHz is readily detectable with the logic implementations of the tubing system shown in FIGS. 3-7. If offset detector 78 determines that the frequency of local oscillator 26 has drifted more than 1.25 MHz from the frequency synthesized under phase locked loop control, it generates a 1.25 (not less than 1.25 MHz) binary signal. In response, mode control unit 72 generates an AFT binary signal which causes mode switch 64 to decouple the output of AFT discriminator 66 from low pass filter 40 and to couple the output of phase comparator 34 to low pass filter 40 instead, thereby initiating phase locked loop control.

When the output of the phase locked loop configuration is decoupled from low pass filter 40 and AFT discriminator 66 is coupled to it instead, mode control 72 generates a binary signal TRIGGER TIME to enable drift timer 74. Drift timer 74, which may, for example, include a resistor and capacitor discharge timing network, generates a signal TIME at the end of a predetermined time interval. If offset detector 78 at any time during the predetermined time interval generates a <1.25 binary signal, mode control unit 72 generates an ADVST (advance step) binary signal which is coupled to step control unit 76. Thus, if during the predetermined time interval a <1.25 signal is generated, phase lock loop control is initiated and an ADVST signal is generated. If a <1.25 signal is generated after the predetermined time interval, phase lock loop control is initiated but an ADVST signal is not generated.

In response to an ADVST signal from mode control unit 72, step control unit 76 causes the factor N to be incremented by 1 from its original or nominal value. As a result, the phase locked loop causes the frequency of the local oscillator signal to be incremented by 1 MHz from its nominal frequency for the selected channel. This in turn would cause the IF frequency of the picture carrier, if one exists for the selected channel, to be shifted by +1 MHz.

When the phase locked loop again attains lock, as determined from the LOCK output signal of lock detector 70, discriminator control is again initiated and the operation described above is repeated. However, if during this cycle of discriminator control, an ADVST signal is generated by mode control unit 72 in response to the generation of a <1.25 MHz signal by offset detector 78 at any time during the predetermined time interval, step control unit 76 causes the value of N to be decremented by 1 from its nominal value. Thereafter, one more sequence of a phase locked loop control cycle, wherein the local oscillator is caused to have a frequency of 1 MHz lower than its nominal value for the selected channel, followed by a discriminator control cycle take place. If offset detector 78 generates a <1.25 signal at any time during the predetermined time interval in the last discriminator control cycle, mode control unit 72 returns local oscillator 26 to phase lock loop control and returns N to its nominal value. Thereafter, the above described tuning algorithm will be repeated because no picture carrier for the selected channel exists, until the viewer selects another channel.

If a picture carrier exists for the selected channel, in one of the three discriminator control cycles, offset detector 78 generates a <1.25 signal during the entire predetermined time interval. That is, if a picture carrier exists for the selected channel, it will be tuned in either the first discriminator control cycle for which the frequency of the local oscillator is initially set to its nominal value, the second discriminator control cycle for which the frequency of the local oscillator is initially set to its nominal value plus 1 MHz, or the third discriminator control cycle for which the frequency of the local oscillator is initially set to its nominal value minus 1 MHz. In response, mode control unit 72 will cause local oscillator 26 to remain under discriminator control and inhibits the generation of an ADVST signal so that N cannot thereafter be incremented or decremented (except when a new channel is selected).

If a <1.25 signal is generated by offset detector 78 after the predetermined time interval, i.e., after a picture carrier for the selected channel has been tuned under discriminator control, because the local oscillator frequency has been drifted more than 1.25 MHz from the local oscillator frequency synthesized during the previous phase locked loop cycle due to a temporary loss of carrier signal resulting from, for example, interference by a passing airplane (airplane flutter), or the like, mode control unit 72 will return control of local oscillator 26 to the phase locked loop. However, because step control unit 76 has been inhibited from either incrementing or decrementing the number N, when the phase locked loop is locked, N will have the value for which the picture carrier was located and tuned prior to the temporary loss of carrier. As a result, the time required to tune local oscillator 26 after a momentary signal dropout will be minimized, and the system will have been prevented from erroneous tuning an undesirable carrier, i.e., the lower adjacent channel sound carrier.

Because the closest undesired carrier to the desired picture carrier is the lower adjacent sound carrier which, for example, for frequency allocations in the United States, is 1.50 MHz above the picture carrier (in the IF frequency range), in the tuning sequence the local oscillator is first incremented rather than decremented to move an undesired lower adjacent sound carrier 1 MHz further away from the desired control range of discriminator 66. In other words, the frequency regions in which there is less likely to be an undesired carrier to which discriminator 66 can tune local oscillator 26 are searched before the frequency regions in which there is more likely to be an undesired carrier, to minimize the possibility of tuning the receiver to an undesired carrier.

In the absence of a picture carrier (or any other carrier), the conventional type of AFT discriminator which may be utilized as discriminator 66 may remain in a substantially balanced condition. Under these circumstances, the frequency of local oscillator 26 may not drift further than 1.25 MHz from the previously synthesized local oscillator frequency during the predetermined time interval and, as a result, a $<1.25$ signal will be generated during the entire predetermined time interval causing the tuning system to terminate its searching operation, as previously described, although, in fact, a picture carrier has not been tuned. To overcome this situation, mode switch 64 couples drift bias unit 68 to the input of low pass filter 40 substantially at the same time it couples discriminator 66 to the input of low pass filter 40. Drift bias unit 68 comprises a source of fixed DC voltage. When the DC voltage is coupled to low pass filter 40, it is integrated to form a ramp signal which causes local oscillator 26 to be swept in a predetermined direction. If no carrier is encountered during the predetermined time interval, a $<1.25$ signal will be generated when frequency of local oscillator 26 has been swept 1.25 MHz (as it should be) and the tuning sequence continues as described above. The upper limit on the magnitude of the fixed DC bias voltage is selected so that if a carrier is within ±1 MHz of 45.75 MHz when discriminator 66 is coupled to low pass filter 40, the output voltage of discriminator 66 will be dominant over it and local oscillator 26 will be controlled so that deviation between the frequency of the carrier found and 45.75 MHz is minimized. The lower limit of the magnitude of the fixed DC bias voltage is selected to determine the rate at which the frequency of local oscillator 26 is swept.

As was previously described, when a new channel is selected, channel selection unit 60 generates a CHANGE binary signal which is coupled to mode control unit 72 and step control unit 76. In response to the CHANGE signal, the logic circuits of step control unit 76 which generate the binary signals which in turn control the incrementing and decrementing of N are reset so that N is at its nominal value for the selected channel. Furthermore, in response to the CHANGE signal, mode control unit 72 resets the inhibition of the ADVST signal and initiate phase locked loop control so that the nominal local oscillator frequency for the selected channel may be synthesized as previously described.

If a viewer selects an improper or "illegal" channel, such as, for example, in the United States channels 00, 01 or channels above 83, band decoder 50 does not generate either a $V_L$ signal (channels 2–6), a $V_H$ signal (channels 7–13), a U signal (channels 14–83). As a result, none of the varactors comprising local oscillator 26 will be energized and local oscillator 26 will not produce a local oscillator signal. As will be subsequently be described, band decoder 50 must be occasionally cycled in order to properly decode the band of a selected channel. Therefore, to ensure that band decoder 50 is occasionally cycled so that it will properly function to select the band when a legal channel is selected, an ILLEGAL binary signal is generated by band decoder 50 and coupled to divide N input switch 42 when a viewer has selected an illegal channel. In response to the ILLEGAL signal divide by N input switch 52 decouples the output of divide by K prescaler 28 from the input of dual modulus divider 44 of divide by N unit 30 and couples a signal having a predetermined frequency (e.g., 2 MHz) to dual modulus divider 44 instead so that band decoder 50 is occasionally cycled.

The ILLEGAl signal is also coupled to mode switch 64 so that the pulses generated by phase comparator 34 are not coupled to low pass filter 40 to prevent an erroneous tuning voltage from being applied to local oscillator 26 from low pass filter 40 when an illegal channel has been selected by a viewer.

Furthermore, since television distribution systems do not in general produce frequency translations for UHF carriers, band decoder 50 coupled a V binary signal to mode control unit 72 so that discriminator control is provided only when a VHF channel has been selected. It is noted that the tuning system of FIG. 1 may be modified to have nonstandard frequency RF carriers in the UHF range.

To describe the operation of divide by N unit 30 to divide the frequency of the output signal of prescaler 28 during phase locked loop control and serve as a counter to evaluate the frequency offset of the local oscillator signal during discriminator control, reference is made to FIGS. 3–12. The implementations of FIGS. 3–7 utilize commercially available components as indicated. However, it will be appreciated that a major portion of the tuning system of FIG. 1 may be formed as an integrated circuit.

Figure 3:
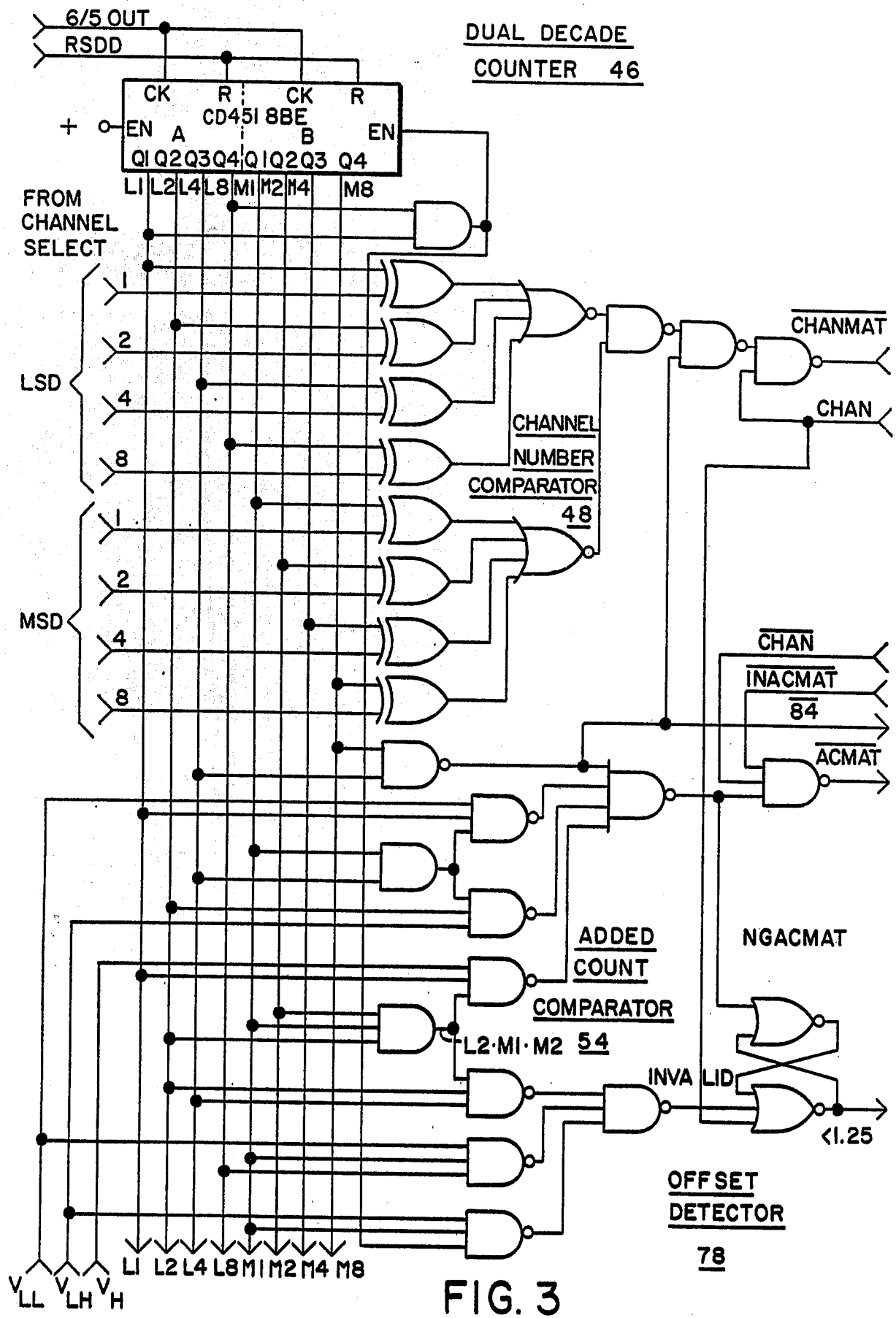
FIGS. 3–7 show logic implementations of various portions of the tuning system shown in FIG. 1.
Figure 4:
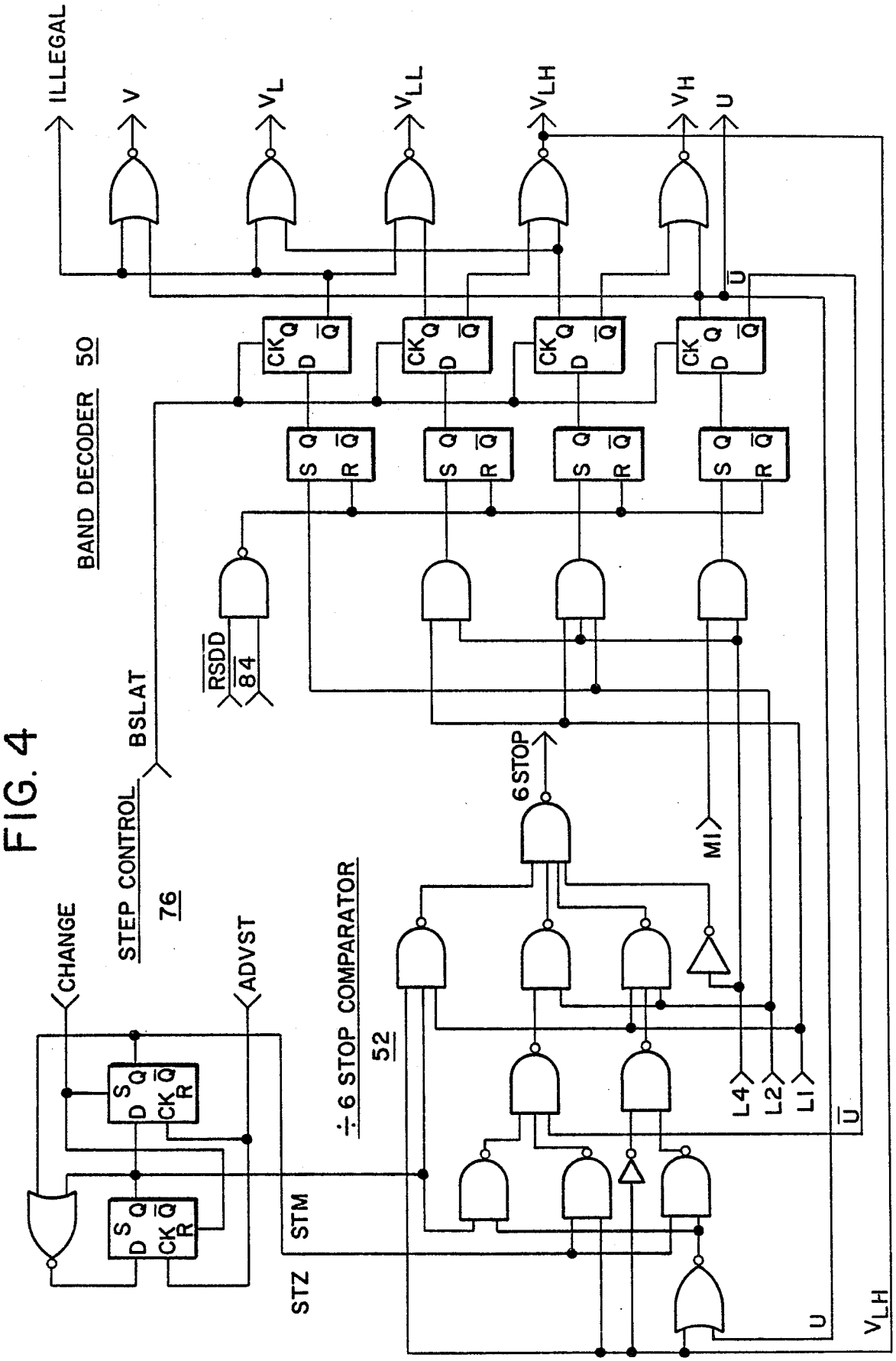
Figure 5:
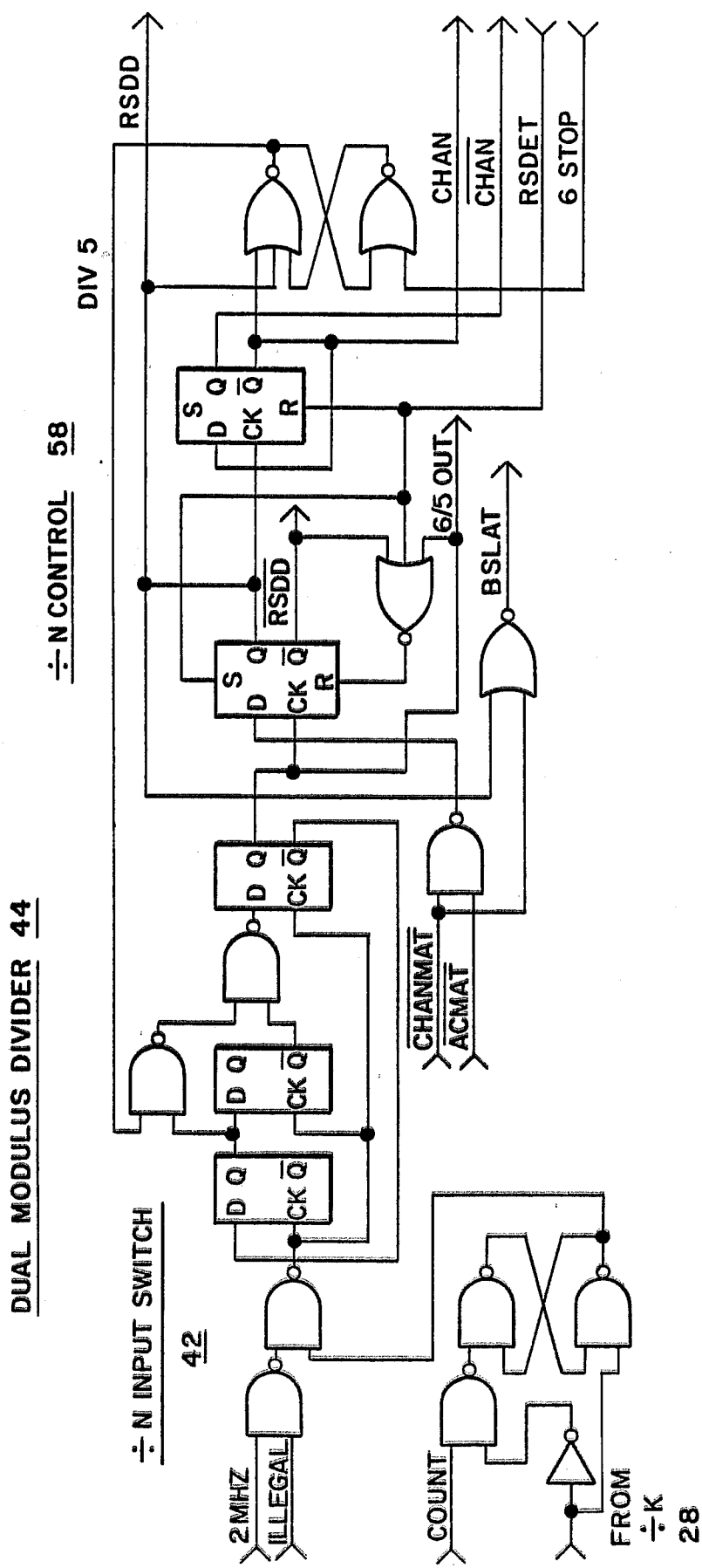

Logic implementations of dual modulus divider 44, dual decade counter 46, channel number comparator 48, divide by 6 stop comparator 52, added count comparator 54 and divide by N control unit 58 comprising divide by N unit 30 are shown in FIGS. 3–5. Also shown in FIGS. 3–5 are logic implementations of band decoder 50, offset detector 78, step control unit 76, which are integrally interconnected with the units comprising divide by N unit 30, and divide by N input switch 42.

An understanding of the operation of the divide by N function of divide by N unit 30 is facilitated by an understanding of the frequency relationships of the signals associated with the various channels a viewer may select. In the United States, for example, in the RF range, the channels are 6 MHz wide and lie between 54 and 890 MHz in four separated bands: a band ($V_{LL}$) including channels 2–4, a band ($V_{LH}$) including channels 5 and 6, a band ($V_H$) including channels 7–13 and a band (U) including channels 14–83. Within each band, the channels are contiguous. The local oscillator frequencies are 45.75 MHz above the corresponding picture carrier frequencies in the RF range in a range between 101 and 931 MHz and also reside in four separated bands corresponding to the four bands in the RF range. In each local oscillator band, there is a 6 MHz spacing between the local oscillator frequencies. The local oscillator frequencies in megahertz are odd integers. One MHz is the greatest common divisor of all the local oscillator frequencies.

Divide by N unit 30 divides the frequency of the output signal of divide by K prescaler 28 by N, where the factor N is the local oscillator frequency in MHz for the selected channel, by counting N periods of the output signal of divide by K prescaler 28. The divide by N counting cycle is composed of two parts: a first portion related to the number of the selected channel and a second portion related to the frequency band in which the selected channel resides. During the first portion, dual modulus divider 44 generates one output pulse (i.e., counts once) for every six input pulses from prescaler 28 (i.e., divides by 6) and dual decade counter 46 counts until the channel number is reached. During the second portion dual modulus divider 44 initially counts by 6 and is later caused to count by 5 while the dual decade counter 46 counts until an added count number is reached. For the second portion, the number of "6's" and "5's" counted and the added count number are related to the frequency band in which the selected channel resides. Thus, there are four sets of numbers corresponding to the four bands. The divide by N counting cycle is represented by the expressions:

$$N = [\text{1st portion}] + [\text{second portion}] \quad (2)$$

$$N = [6 \text{\#}] + [6B + 5(A-B)] \quad (3)$$

where, $N$ is the integer number of MHz of the local oscillator frequency
\# is the channel number
$A$ is the added count
$B$ is the number of 6's counted during the second portion
$A-B$ is the number of 5's counted during the second portion Dual decade counter 46 is reset at the end of each portion and thus is reset twice per divide by N cycle. It is not reset when the modulus of the dual modulus divider 44 is changed from 6 to 5 during the second portion of the divide by N cycle. Resetting the dual decade counter takes an extra cycle of the output signal of dual modulus divider 44 so that, in fact, the equation (3) for the logic implementation of FIGS. 3–5 is:

$$N = [6 \text{\#} + 6] + [6(B-1) + 5(A-B-1) + 5] \quad (4)$$

Table 1 below shows the values of the various variables of equation (4) for the four bands $V_{LL}$, $V_{LH}$, $V_H$ and U.

TABLE 1

Number Chart for Divide by N Algorithm

| | \# | A | B | A-2 | B-1 |
|---|---|---|---|---|---|
| $V_{LL}$ | 2–4 | 17 | 4 | 15 | 3 |
| $V_{LH}$ | 5,6 | 18 | 3 | 16 | 2 |
| $V_H$ | 7–13 | 35 | 4 | 33 | 3 |
| U | 14–83 | 86 | 3 | 84 | 2 |

Figure 8:
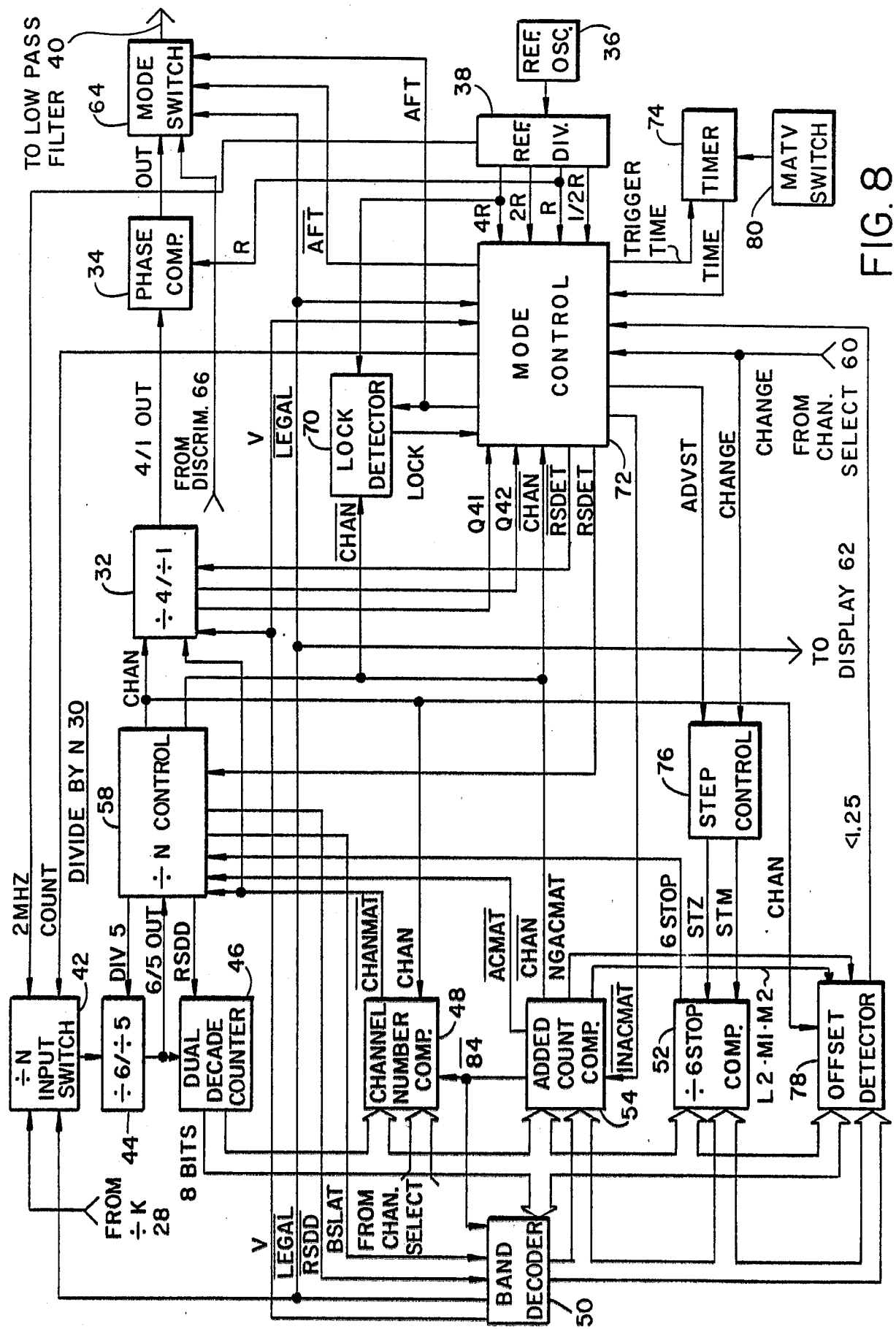
FIG. 8 shows a block diagram indicating the interconnections of the various logic implementations shown in FIGS. 3–7.
Figure 9:
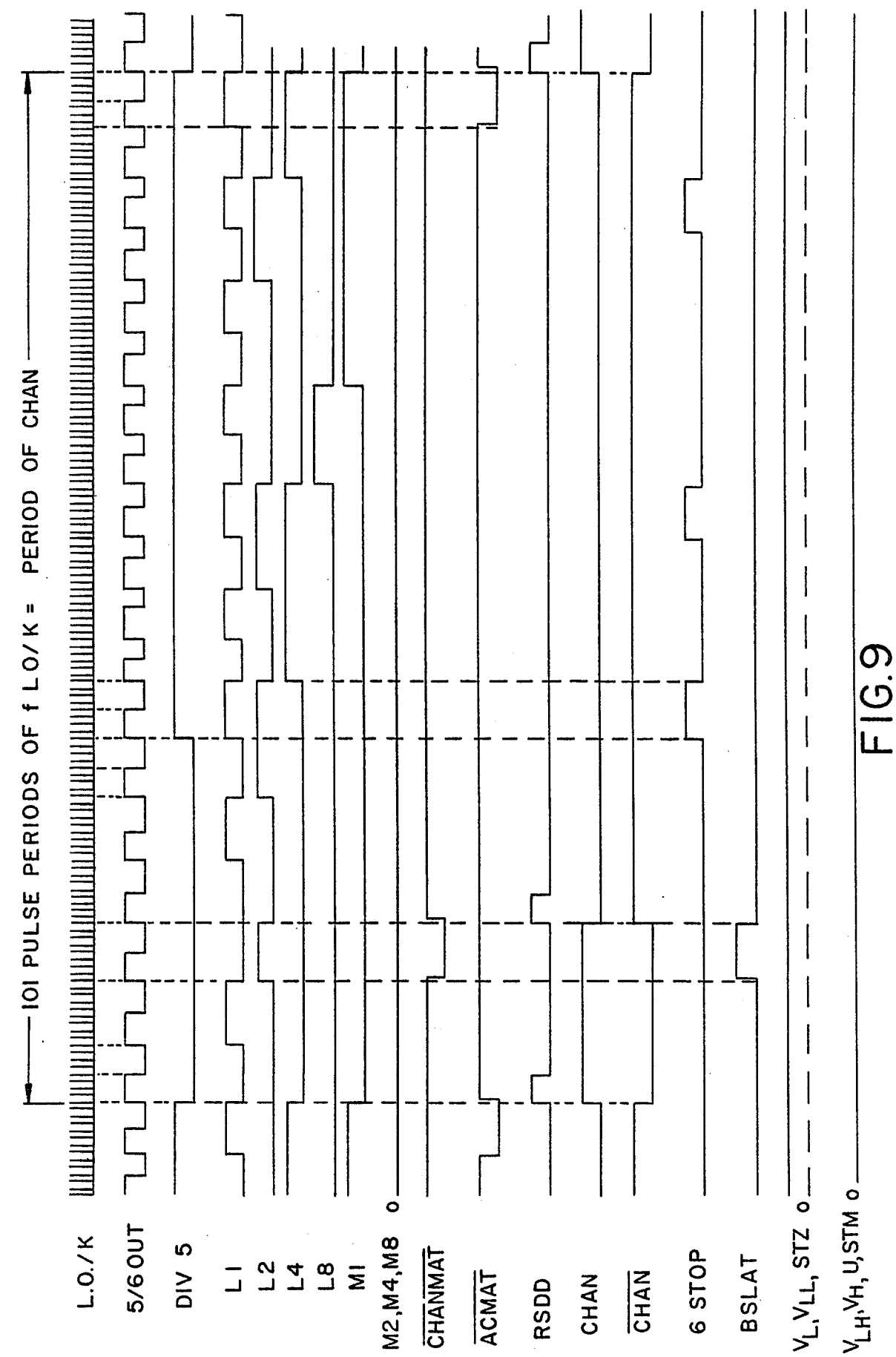
FIGS. 9–12 show graphical representations of timing diagrams associated with the logic implementations shown in FIGS. 3–7.

The divide by N operation of divide by N unit 30 shown in block diagram form in FIG. 8 can best be illustrated by way of an example in which the selected channel is 2. Concurrent reference should be made to the FIG. 9 which shows the time relationships between varius signals associated with divide by N circuit 30 when it is dividing the frequency of the input signal from prescaler 28 by the number N, i.e., 101, corresponding to channel 2. Just prior to the start of the channel number (first) portion of the divide by N cycle, a positive-going pulse, RSDD (Reset Dual Decade), is generated by divide by N control unit 58 to reset dual decade counter 46. Simultaneously divide by N control unit 58 causes a DIV5 (Divide by 5) signal to go low (a logic "0") which causes dual modulus divider 44 to thereafter divide by 6.

On each positive-going transition of the output signal of dual modulus divider 44, dual decade counter 46 is incremented by 1. When the BCD output of dual decade counter 46, 4 bits (L1 – L8) for the least significant digit and 4 bits (M1 – M8) for the most significant digit, reach a count corresponding to 02, a match occurs with the BCD signals provided by channel selection unit 60. In response, channel number comparator 48 causes a signal $\overline{\text{CHANMAT}}$ (Chan Match) to low. At the next positive-going transition of the output signal of dual modulus divider 44, a positive-going RSDD pulse resets dual decade counter 46. The RSDD pulses causes the channel number (first) portion to last one extra cycle. During the duration of the channel (first) portion of the divide by N cycle, divide by N control unit 58 generates a positive going CHAN pulse which is coupled to divide by 4/divide by 1 divider 32 as the output of divide by N unit 30.

At this point, the added count (second) portion of the divide by N cycle is initiated and dual decade counter 46 once again starts to count up from 00. However, the DIV5 signal is still low and dual modulus divider 44 continues to divide by 6. When the count of dual decade counter 46 reaches 03 (B−1 in Table 1), divide by 6 stop logic unit 52 detects a match and causes a 6 STOP signal to go high (a logic "1"). In response, divide by N control unit 58 causes the signal DIV5 to go high and dual modulus divider 44 is thereby caused to thereafter divide by 5. However, dual decade counter 46 is not reset and continues counting. When the count reaches 15 (A−2 in Table 1), added count comparator 54 detects a match and causes an $\overline{\text{ACMAT}}$ (Added Count MATch) signal to go low. At the next reset positive-going transition of the output signal of dual modulus divider 44, divide by N control unit 58 generates a positive-going RSDD pulse which resets dual decade counter 46 and causes the signal DIV5 to go low. As a result, dual decade counter 46 is reset and dual modulus divider 44 is caused to thereafter divide by 6. The divide by N cycle is now complete.

A divide by N unit similar to divide by N unit 30 of FIG. 1 in which a dual modulus divider selectively divides by 6 or 7 rather than by 6 or 5 is described in U.S. patent application Ser. No. 662,097, filed for R. M. Rast on Feb. 27, 1976, assigned to the same assignee as the present invention and now issued as U.S. Pat. No. 4,009,459, which is hereby incorporated by reference.

Turning now to the detailed logic implementations of divide by N unit 30 shown in FIGS. 3–5, it is seen in FIG. 5 that dual modulus divider 44 comprises first and second cascaded D-type flip-flops and a third D-type flip-flop whose input is selectively coupled to the Q output of the second D-type through a NAND gate network. When the DIV5 signal, coupled to the NAND gate network, is high, dual modulus divider 44 divides by 5. When the DIV5 signal is low, dual modulus divider 44 divides by 6.

In FIG. 3, it is seen that dual decade counter 46 comprises a two-decimal-digit synchronous counter such as, for example, the CD4518BE COS-MOS (complimentary symmetry metal oxide semiconductor) type counter available from RCA Corporation. The count of dual decade counter 46 is incremented on positive transitions of the output signal of dual modulus counter 44. Positive-going RSDD pulses from divide by N control unit 58 cause the counter to be reset. As earlier described, the output signals of dual decade counter 46 include a first group of four BCD (L1–L8) signals for the lowest significant digit and a second group of four BCD signals (M1–M8) for the most significant digit. It should be noted that the most significant digit portion of dual decade counter 46 need only be a binary counter (rather than decimal) since the highest count is 84.

In FIG. 3 it is seen that channel number comparator 48 receives 8 bits from channel selection unit 60 and 8 bits from dual decade counter 46. When the signal CHAN generated by divide by N control unit 58 goes high (i.e., during the channel portion of the divide by N cycle) in response to a match between respective pairs of bits, channel number comparator 48 causes the $\overline{CHANMAT}$ signal to go low. As the highest channel number is 83, if a count 84 is reached, a signal $\overline{84}$, generated by added count comparator 54, causes the signal $\overline{CHANMAT}$ to go low.

In FIG. 3 it is seen that the 8 bits from dual decade counter 46 are also coupled to added count comparator 54. Furthermore, band signals $V_{LL}$ (channels 2–4), $V_{LH}$ (channels 5–6) and $V_H$ (channels 7–13) generated by band decoder 50 in a manner to be described are coupled to added count comparator 54. When a match occurs, the signal $\overline{ACMAT}$ generated by added count comparator 54 goes low. The values (A−2) for which a match occurs in each band are shown in Table 1 above. If a match has not occurred before a count of 84 has been reached, added count comparator 54 causes $\overline{ACMAT}$ to go low. The signal $\overline{ACMAT}$ is inhibited from going low unless both $\overline{CHAN}$, generated by divide by N control unit 58, and $\overline{INACMAT}$, generated by mode control unit 72, in a manner to be described, are both high. In this manner the output of added count comparator 54 is inhibited except during the second portion of the divide by N cycle. The signal $\overline{INACMAT}$ is utilized when discriminator 66 is controlling local oscillator 26 in evaluating how far the local oscillator frequency has drifted from the value synthesized under phase locked loop control. Added count comparator 54 also generates a signal NGACMAT (Not Gated Added Count MATch) which is coupled to the offset detector 78. The signal NGACMAT goes high whenever an added count match occurs regardless of the states of the $\overline{CHAN}$ and $\overline{INACMAT}$ signals. The signal NGACMAT is also utilized in the evaluation of how far the frequency of local oscillator 26 has drifted from the value synthesized under phase locked loop control. Furthermore, the signal $\overline{84}$, coupled to the channel number comparator 48 and band decoder 50, is generated by added count comparator 54. Added count comparator 54 also "ands" the signals L2, M1 and M2 to form a signal L2·M1·M2 representing a count of 32 which is coupled to offset detector 78.

In FIG. 4 it is seen that 3 least significant bits (L1–L4) of the 8 bits from dual decade counter 46, the band signals $V_{LH}$ (channels 5–6), U (channels 14–83) and U from band decoder 50 and the signals STZ (STep Zero) and STM (STep Minus) from step control unit 76 are coupled to divide by 6 stop comparator 52. The states of the signals STZ and STM for the three step conditions described before are given in Table 2 below.

TABLE 2

|     | 0 | +1 MHz | −1 MHz |
|-----|---|--------|--------|
| STZ | 1 | 0      | 0      |
| STM | 0 | 0      | 1      |

The count (B−1) of dual decade counter 46 at which divide by 6 stop comparator 52 causes the 6 STOP to go high depends on the band in which the selected channel resides and the states of STZ and STM, i.e., the step condition given in Table 2 above. The values of B−1 at which a match occurs for the various bands and step conditions is given in Table 3 below.

TABLE 3

| Values of B-1 for the Three Frequency Steps | | |
|---|---|---|
| Deviation of $f_{LO}$ from Nominal | | |
| 0 | +1 MHz | −1 MHz |
|---|---|---|
| $V_{LL}$   3 | 4 | 2 |
| $V_{LH}$   2 | 3 | 1 |
| $V_H$   3 | 4 | 2 |

Thus, by controlling the value of B−1, the duration of the divide by N cycle may be incremented and decremented. Correspondingly, from an examination of expression (4), it may be seen by controlling the value of B−1 in accordance with Table 3, the frequency of local oscillator 26 may be incremented and decremented by 1 MHz.

Since only three bits of the 8 bits provided by dual decade counter 46 are utilized by divide by 6 stop comparator, it is conceivable that the signal 6 STOP can go high several times during the divide by N cycle. However, divide by N control unit 58 ignores the 6 STOP signal during the channel number (CHAN) portion and only the first occurrence is important during the added count ($\overline{CHAN}$) portion.

Band decoder 50 shown in FIG. 4 utilizes the 8 bits representing the accumulated count of dual decade counter 46 and a sequential logic arrangement to decode the band in which the selected channel resides. A similar arrangement is described in the aforementioned U.S. patent application Ser. No. 662,097. The band information is refreshed once per divide by N cycle during the channel number (CHAN) portion. Four set-reset (S-R) flip-flops, one for each of the bands, are reset in response to a negative-going $\overline{RSDD}$ pulse from divide by N control unit 58 just prior to the beginning of the channel number portion of the divide by N cycle. Each S-R flip-flop is assigned to a different band and each is set when the count reaches the lowest channel in the respective band, i.e., 2 for $V_{LL}$, 5 for $V_{LH}$, 7 for $V_H$ and 14 for U. If the requested channel is 0 or 1, no S-R flip-flop is set. If the requested channel is higher than 83 all S-R flip-flops are reset when the count reaches 84 in response to the signal $\overline{84}$ from the added count comparator 54 going low. When a match occurs in channel number comparator 48, a signal BSLAT (Band Select LATch) generated by divide by N control unit 58 goes high causing the states of the S-R flip-flops to be preserved in D-type flip-flops whose inputs are respectively coupled to the set (Q) outputs of the S-R flip-flops. Combinational logic derives the band information from the states of the D-type flip-flops. The band in which the selected channel resides in the highest band for which a respective D-type flip-flop is set. If no D-type flip-flop is set because an illegal channel has been requested, band decoder 50 causes a signal ILLEGAL to go high.

Band decoder 50 also couples a $V_L$ (channels 2–6), a $V_H$ (channels 7–13) and a U (channels 14–83) to local oscillator 26 to control its frequency range as was previously described. Furthermore, a high ILLEGAL signal causes divide by N input switch 42 to couple the 2 MHz signal from reference divider 38 to dual modulus divider 44 when the selected channel is illegal. This ensures that the band decoder 50 is kept operating during a time when the signals $V_L$, $V_H$ and U are low and as a result local oscillator 26 is not providing an output signal as was previously described.

Figure 6:
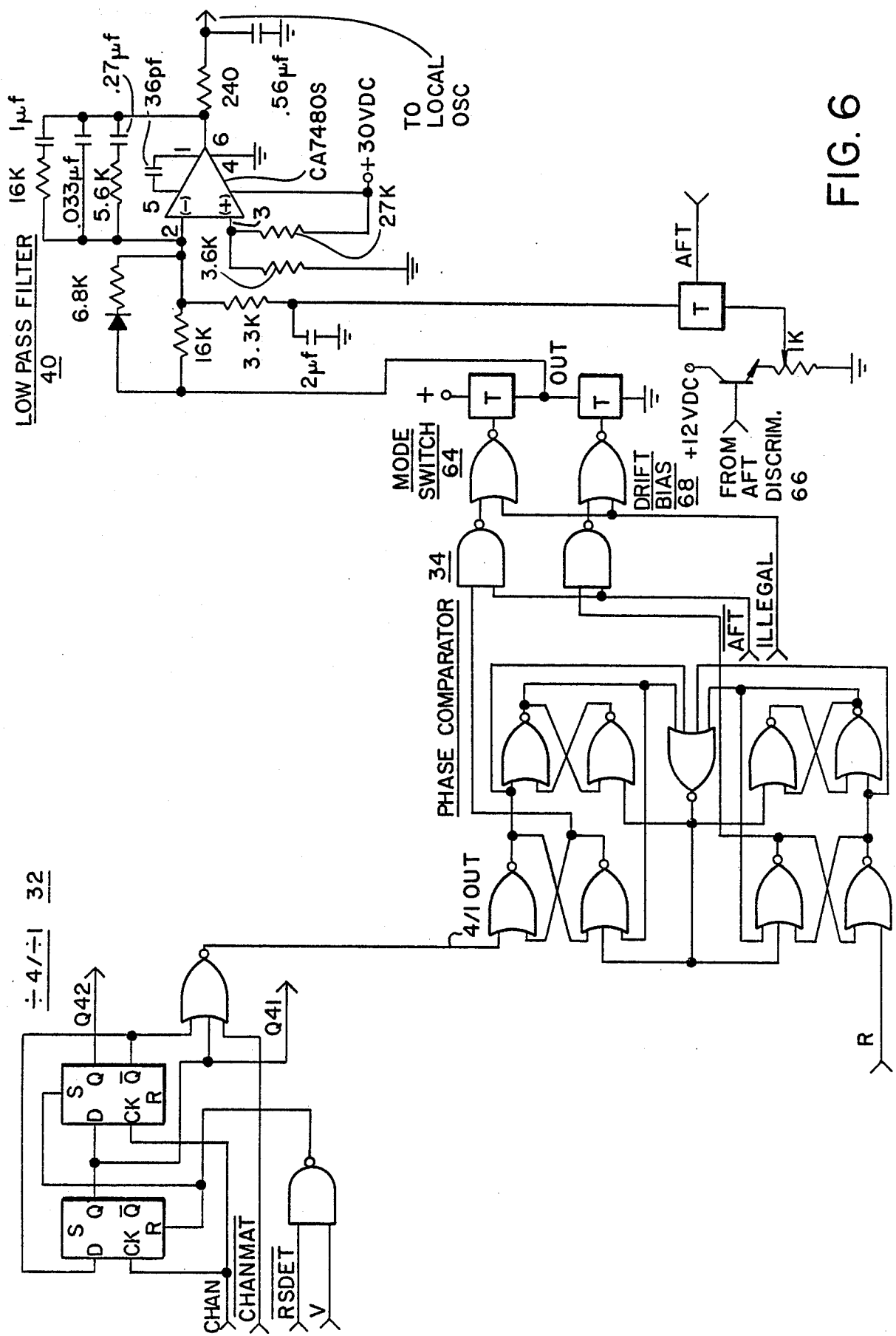

The logic implementation of divide by 4/divide by 1 divider 32 shown in FIG. 6 receives the signals CHAN from divide by N control unit 58, the signal V (indicating that a VHF channel has been selected) from band decoder 50, and the signal CHANMAT from channel number comparator 48. The signal CHAN is used as the clock for the two programmable D-type flip-flops comprising divider 32. When the signal V is high, divider 32 divides by 4. When the signal V is low, divider 32 divides by 1. The factor of 4 is inserted for VHF channels to compensate for the factor of 4 difference between the value of K of prescaler 28 for UHF channels (e.g., 256) and the value of K for VHF channels (e.g., 64) to allow the source reference frequency, $f_{REF}$, e.g., 3.90625 KHz to be utilized for both the VHF and UHF ranges. This equality in reference frequency is desirable since it eases the stability requirements on low pass filter 40.

The output signal of divider 32, 4/1OUT, is coupled to phase comparator 34 during the duration of the $\overline{\text{CHANMAT}}$ signal. The signal $\overline{\text{RSDET}}$ (the logic complement of ReSet DETector), coupled to divider 32 goes low to reset the flip-flops comprising divider 32 during the offset evaluation sequence as will be subsequently described. Furthermore, the output signals $Q_{41}$ and $Q_{42}$ of the flip-flops comprising divider 32, coupled to mode control unit 72 are utilized for the offset evaluation. The time relationship between the signals CHAN, $Q_{41}$, $Q_{42}$ and 4/1OUT graphically illustrated in FIG. 10.

Figure 7:
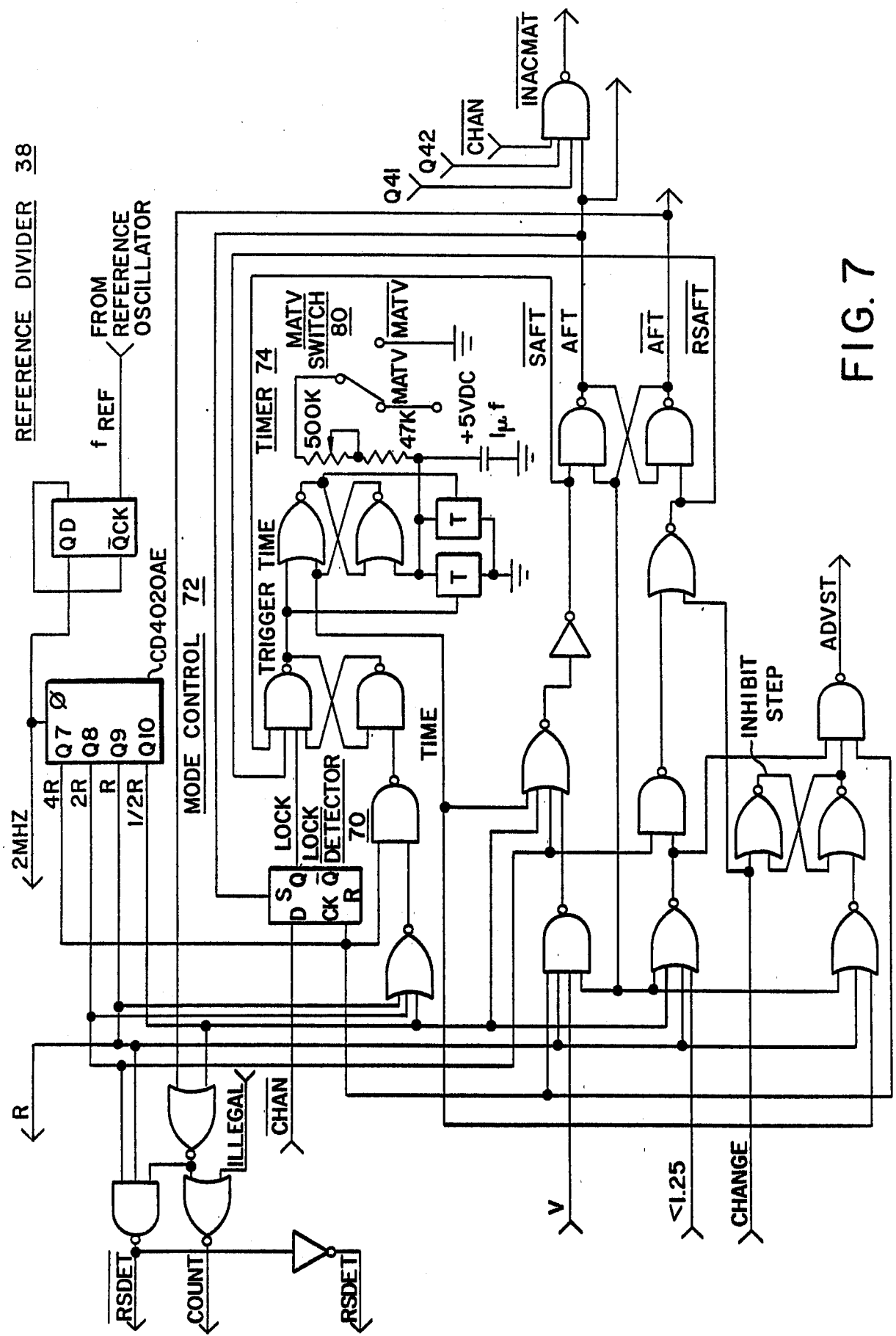

The logic implementation of reference divider 28 shown in FIG. 7 includes a D-type flip-flop to derive a 2 MHz signal from the 4 MHz signal coupled to it from reference oscillator 36. The 2 MHz signal is coupled to divide by N input switch 42 and also to a 10 stage binary ripple counter, comprising for example a CD4020AE COS-MOS type counter available from RCA Corporation. The binary ripple counter counter generates the reference frequency signal R (3.90625 KHz), its binary multiples 2R and 4R and its binary submultiple R/2. The signals R, 2R, 4R and R/2 are timing signals for mode control unit 72. The signal 4R is also coupled to lock detector 70. The time relationships between the signals R, 2R and 4R are graphically illustrated in FIG. 10.

The logic implementation of phase comarator 34 in FIG. 6 is similar to that of the phase comparator II in the CD4046 COS-MOS integrated circuit available from RCA Corporation. The input signals are the 4/1OUT signal from the divide by 4/divide by 1 divider 32 and the R signal from reference divider 38. Its output signal is coupled to active low pass filter 40. Phase comparator 34 comprises two edge-triggered memory networks each comprising two cascaded cross coupled type of flip-flops. The outputs of the second flip-flops of the memory networks are respectively coupled to two transfer (T) gates shown as being included in mode switch 64. The two transfer gates are connected in cascode between a source of positive supply voltage and ground and their common junction forms a summing point at which the output signal OUT of phase comparator 34 is developed.

In response to the phase difference between the two input signals, the two transfer gates are selectively turned on and off and the filter capacitors of low pass filter 40 are correspondingly charged and discharged. The polarity of the output pulse of phase comparator 34 depends on which input signal provides the first positive-going transition and represents the polarity of the phase error between the two input signals. The pulse width of the output pulse is determined by the time delay between the positive-going transitions of the two input signals and represents the magnitude of the phase error between the two input signals. When the two input signals are substantially in phase, the two transfer gates are both turned off and the filter capacitor of low pass filter 40 is neither charged or discharged by any appreciable amount. The time relationships between the signals 4/1OUT, R and OUT when the phase locked loop approaches a locked condition are graphically illustrated in FIG. 10.

An implementation of mode switch 64 is shown in FIG. 6. Two gating networks, each comprising a NAND gate and a NOR gate connected in cascade, are respectively coupled between the two edge-triggered memory circuits comprising phase comparator 34 and the two previously described transfer gates included as part of mode switch 64. An $\overline{\text{AFT}}$ signal is coupled to the NAND gates from mode control 72 and the ILLEGAL signal is coupled to the NOR gates from band decoder 50. When the $\overline{\text{AFT}}$ signal goes low during the discriminator control mode, the outputs of the two edge-triggered memory circuits of phase comparator 34 are decoupled from low pass filter 40 by virtue of the two NAND gates. Similarly, when the ILLEGAL signal goes high because an illegal channel has been selected, phase comparator 34 is decoupled from low pass filter 40 by virtue of the two NOR gates. As previously stated, it is desirable to decouple phase comparator 34 from low pass filter 40 when an illegal channel has been selected so that the varactor tuning voltage of local oscillator 26 is maintained. Otherwise, the loop lockup time could be increased because the correction pulses applied to low pass filter 40 when an illegal channel has been selected could drive the tuning voltage away from the correct voltage required when a legal channel is ultimately selected.

Another part of mode switch 64 includes an NPN transistor configured as an emitter follower. The error voltage developed by discriminator 66 is coupled to the base of the transistor. A portion of the AFT error voltage is selectively coupled via a transfer gate (T) to the inverting input of an operational amplifier such as, for example, a CA7480S integrated circuit available from RCA Corporation, included in low pass filter 40.

AFT discriminator 66 has an S-shaped voltage versus frequency transfer characteristic with the voltage, for example, varying between 0 and +12 volts and a nominal output voltage of, for example, 6 volts for a no-signal condition. A one kiloohm potentiometer connected to the emitter of the NPN transistor serves two functions. Firstly, it attenuates the AFT error voltage such that the no-signal discriminator error voltage is substantially equal to the bias voltage applied to the non-inverting input of the op amp in low pass filter 40, and thus causes the operational amplifier inputs to be substantially DC balanced. Secondly, it serves as the implementation of drift bias 68 since adjusting the pot to slightly unbalance the operational amplifier inputs introduces a DC bias in the discriminator error voltage.

When the AFT signal from mode control unit 72 goes high, a portion of the discriminator error signal is coupled to low pass filter 40. The bias voltage is integrated by low pass filter 40 to cause the frequency of local oscillator 26 to be swept in a predetermined direction. from mode Lock detector 70 as shown in FIG. 7 is a programmable D-type flip-flop having the signal 4R derived by reference divider 38 coupled to its clock (CK) input and the signal $\overline{CHAN}$, derived by divide by N control unit 58, coupled to its data (D) input. On positive-going transitions of the signal 4R, the signal $\overline{CHAN}$ is sampled. If the loop is locked, the signal CHAN will be high. As a result, the signal LOCK developed at the Q output of the D-type flip-flop will go high. If the loop is unlocked, samples will occur when the signal $\overline{CHAN}$ is low with the result that the signal LOCK will go low. Furthermore, the signal AFT frommode control unit 72 is coupled to the set (S) input of the D-type flip-flop to hold the LOCK signal high when the tuning system is under discriminator control.

Figure 2:
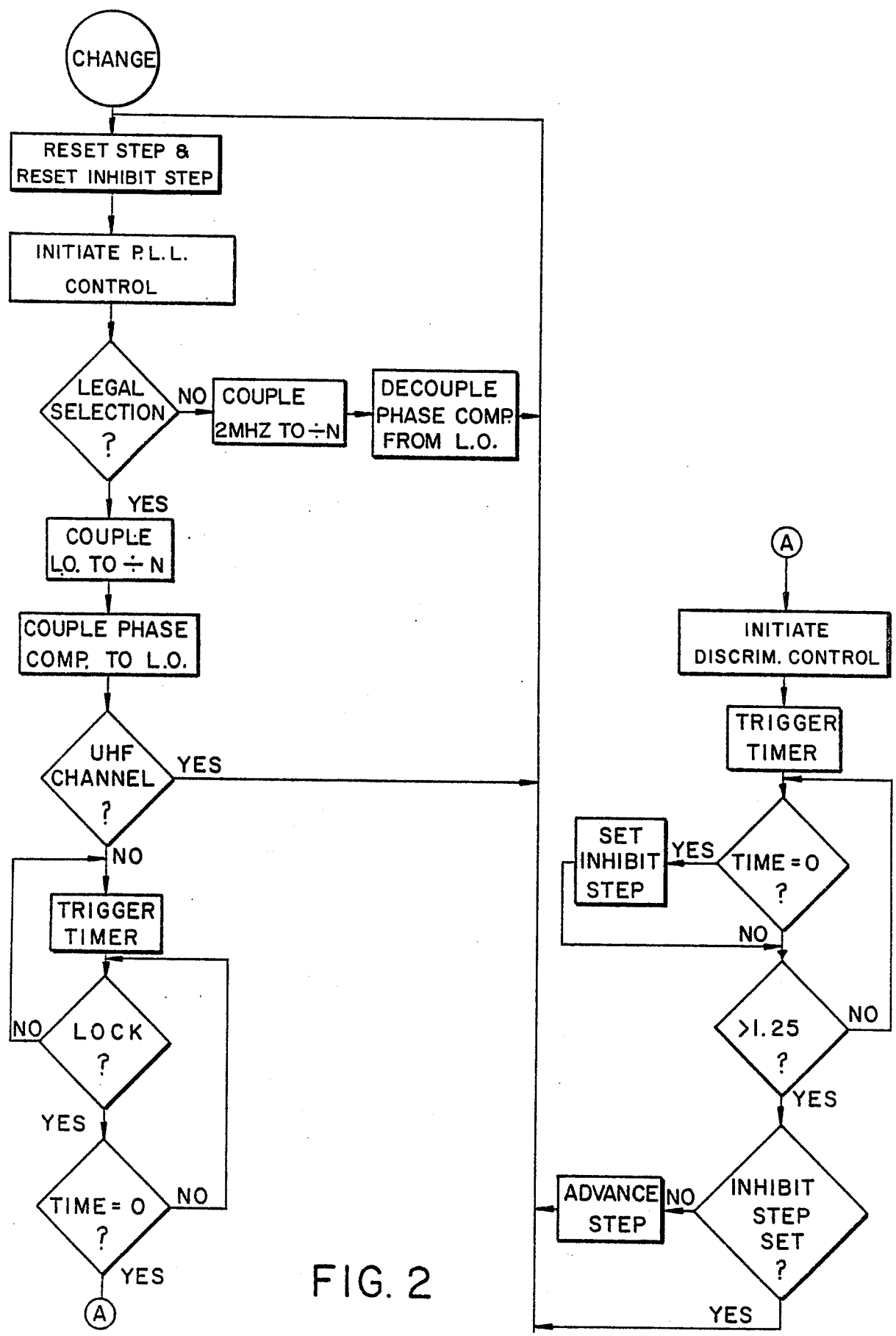
FIG. 2 shows a flow chart indicating the tuning algorithm followed by the tuning system of FIG. 1.

As is indicated in the tuning algorithm shown in FIG. 2, and as will be explained further with reference to the logic implementation of mode control unit 72 also shown in FIG. 7, the LOCK signal is in essence integrated using a retriggerable one-shot multivibrator comprising a cross-coupled set-reset flip-flop and a resistor-capacitor network, included in timer 74. When phase locked loop is first initiated, the one-shot multivibrator is triggered. Further whenever the LOCK signal goes low, indicating that the phase locked loop is not locked, the one-shot multivibrator is retriggered. When the phase locked loop achieves lock, the LOCK signal will remain high and thus will no longer cause the one-shot to be retriggered. However, discriminator control is not initiated by mode control unit 72 until the one-shot multivibrator resets itself.

To evaluate the offset between the local oscillator frequency during the interval in which local oscillator 26 is under discriminator control and the local oscillator frequency synthesized under phase locked loop control, portions of divide by N unit 30 utilized to divide the frequency of the output signal of prescaler 28 by N, previously described, are used in conjunction with offset detector 78, mode control unit 72 and divide by 4/divide by 1 divider 32. This arrangement is advantageous since it makes use of a major portion of the logic circuitry already available for other functions of the tuning system. In essence, when local oscillator 26 is under discriminator control, divide by N unit 30 is used as a frequency counter to evaluate the frequency offset between the local oscillator frequency and its originally synthesized value.

As was previously stated, 1.25 MHz is chosen as the offset threshold because it is a frequency offset readily counted by divide by N unit 30 and allows for some overshoot beyond the desired control range of discriminator 66 (e.g., ±1 MHz) while limiting discriminator control within a range excluding undesired carriers such as the lower adjacent channel sound carrier which is, e.g., 1.5 MHz above the picture carrier (in the IF frequency range).

Figure 11:
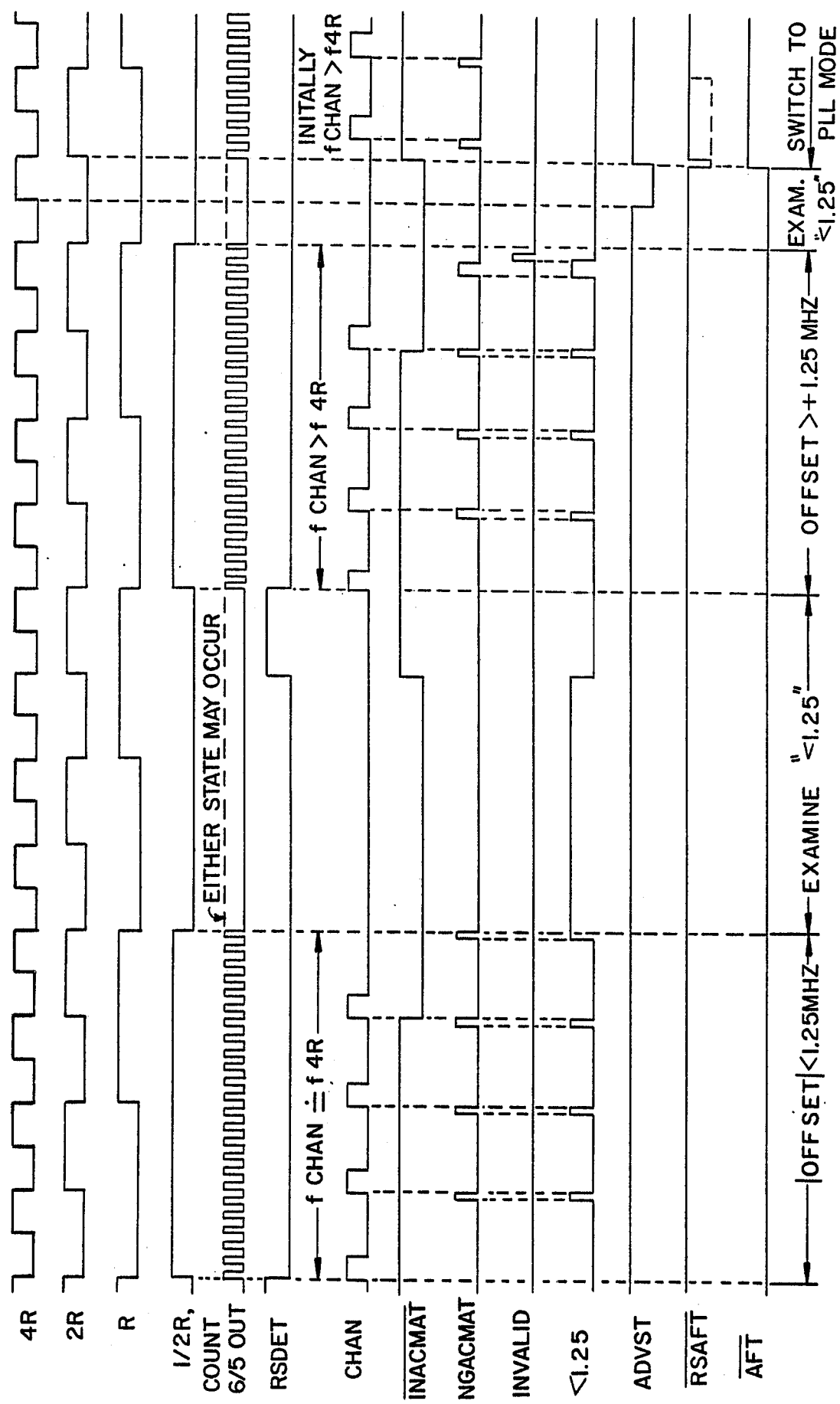

With reference to FIG. 11, which shows the time relationships between various signals associated with the offset evaluation, when local oscillator 26 is under locked phase locked loop control, for each cycle of the frequency reference signal R, the divide by N cycle (CHAN) repeats four times, when VHF channels are being tuned. This is mathmatically expressed in equation (1). By combining expressions (1) and (4) and substituting the values 64 for K, 4 for M, and $f_R$ for $f_{REF}/R$ REF/R (where $f_R$ is the frequency of the output signal of reference divider 38) the frequency, $f_{LO}$, of the local oscillator under locked phase locked loop control (for VHF channels) is $$f_{LO} = 64 \times \{[6\# + 6] + [6(B-1) + 5(A-B-1) + 5]\} \times 4 \times f_R \quad (5)$$

With reference to expression (5), it may be seen that if during the last (i.e., fourth) divide by N cycle occurring in one cycle of the signal R, one less "5" were counted, the synthesized local oscillator frequency would be changed by −1.25 MHz. Similarly, if one extra "5" were counted, the synthesized local oscillator frequency would be changed by +1.25 MHz. Thus, if during the tuning operation in which local oscillator 26 is under discriminator control, the divide by N cycle were initially synchronized with the cycle of the signal R, and if the number of "5" counts during the added count portion were evaluated during the last divide by N cycle in the reference interval, the frequency offset from the synthesized local oscillator frequency could be determined. Furthermore, it is noted that although the length of the added count portion depends on the band in which the selected channel resides, it does not depend on the selected channel. This, as will be seen, simplifies the logic implementation of offset detector 78 which evaluates the number of "5" counts during the added count portion when local oscillator 26 is under discriminator control.

Figure 10:
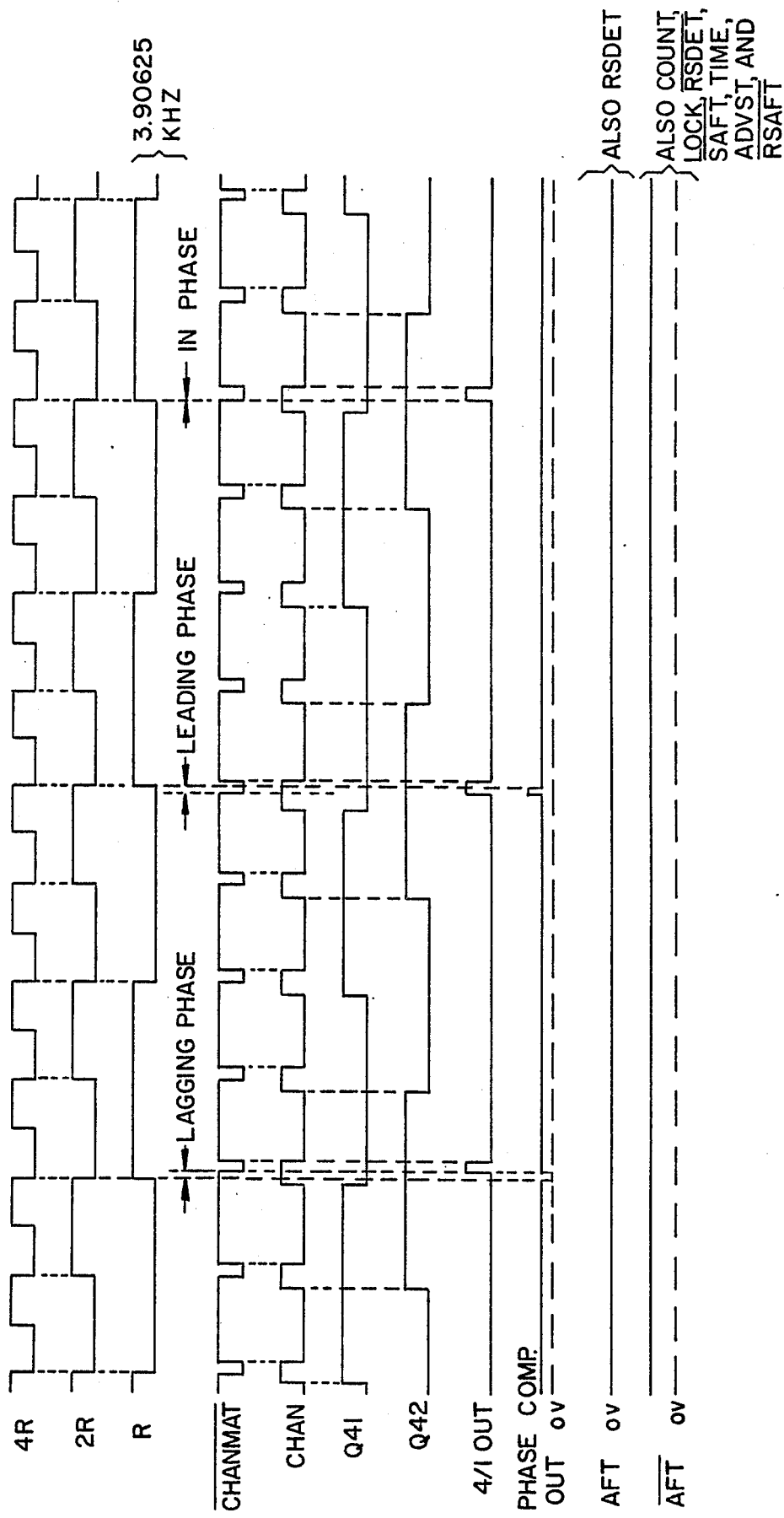

Referring now to the logic implementations shown in FIGS. 3, 5, 6 and 7 and the signals shown in FIG. 10, the specific manner in which a local oscillator frequency offset is evaluated during the discriminator control cycle will be described. The timing signal R/2, having a frequency equal to one-half the reference frequency, is coupled to mode control unit 72 from reference divider 38 where it is used to generate a signal COUNT. The COUNT signal is coupled to divide by N input switch 42. When the COUNT signal is high the output signal of prescaler 28 is coupled to dual modulus divider 44. Conversely, when the COUNT signal is low, the output signal of prescaler 28 is not coupled to dual modulus divider 44. Thus, the COUNT signal is used to permit divide by N unit 30 to count only during alternate cycles of the reference frequency signal R.

Just prior to the positive-going transition of the COUNT signal, a positive-going pulse, RSDET (ReSet DETector) is coupled to divide by N control unit 58 from mode control unit 72, causing the signal CHAN to go high thereby initiating the channel number portion of the divide by N cycle, causing the signal DIV5 to go low thereby causing dual modulus divider to divide by 6 and generating a positive-going pulse, RSDD, thereby resetting dual decade counter 46 to a count of 00. The negative-going pulse, RSDET is used to reset divide by 4/divide by 1 divider 44 thereby causing the signal $Q_{41}$ to go low and the signal $Q_{42}$ to go high. The RSDET pulse is also coupled to the band decoder 50 to reset the four set-reset flip-flops and thus prepare it for band decoding. In summary, then, just prior to the COUNT signal going high, the divide by N unit is prepared to begin counting in the channel number portion of its cycle.

When the signal COUNT goes high, divide by N unit 30 begins counting in its normal fashion. During the fourth cycle of the CHAN signal, the signals $Q_{41}$ and $Q_{42}$ derived by divider 44 are both high. In response, mode control unit 72 causes the signal $\overline{INACMAT}$ (INhibit Added Count MATch) to go low. As a result, added count comparator 54 prevents $\overline{ACMAT}$ from going to low when an added count match occurs and divide by N control unit 58 causes the added count portion of the divide by N cycle to continue. Furthermore, because the $\overline{ACMAT}$ signal is inhibited from going low, divide by N control unit 58 does not cause DIV5 to go low as it normally would in response to a low $\overline{ACMAT}$. As a result, dual modulus divider 44 continues to divide by 5.

When the signal COUNT goes low, the output of prescaler 28 is decoupled from divide by N unit 30 and divide by N unit 30 stops counting. This means that a count residue is preserved in dual modulus counter 44 and dual decade counter 46. However, divide by K prescaler 28 continues to count. The count residue in dual decade counter 46 corresponds to the added count. If the count in prescaler 28 and the count residue in dual modulus divider 44 could be ignored, the residue in dual decade counter could be evaluated to determine how far the frequency of local oscillator 26 had drifted from its synthesized frequency, i.e., its offset.

Offset detector 78 includes combinational logic to examine the added count (AC) residue in dual decade counter 46. Offset detector 78 also includes a set-reset (S-R) flip-flop, comprising two cross-coupled NAND gates, at whose set (Q) output the signal <1.25 is developed. The signal CHAN is high whenever the divide by N cycle is in its channel number portion and is used to reset the S-R flip-flop causing the signal <1.25 to go low. Thus, at the beginning of the added count portion of the last (fourth) divide by N cycle during the period of the COUNT signal, the signal <1.25 is low.

Whenever the accumulated count in dual decade counter 46 equals the number A−2, an added count match occurs and an NGACMAT signal is coupled from added count comparator 54 to the S-R flip-flop of offset detector 78 to set the signal <1.25 high. However, if the local oscillator frequency is below the predetermined offset, the added count value of A−2 will not be reached during the duration of the COUNT signal and, as a result, the offset detector's flip-flop will not be set and the signal <1.25 will remain low. If on the other hand, if the local oscillator frequency is higher than its synthesized value, because $\overline{ACMAT}$ has been inhibited from going low, counting does not terminate if a match occurs in added count comparator 54 and the count in dual decade counter 46 continues to accumulate. If the count in dual decade counter 46 increases to a value A+1 corresponding to an offset of 1.25 MHz, the combinational logic of offset detector detects the occurrence and the S-R is reset (after having been set when the value A−2 was reached) causing the signal <1.25 to go low. Table 4 below shows which causes the S-R flip-flop of offset detector 78 to be set and reset for the various bands.

TABLE 4

| VHF Band | Set <1.25 | Reset <1.25 |
|---|---|---|
| $V_{LL}$ | 15 | 18 |
| $V_{LH}$ | 16 | 19 |
| $V_H$ | 33 | 36 |

As earlier mentioned, when the COUNT signal goes low the local oscillator signal is decoupled from divide by N unit 30 and dual decade counter 46 stops counting. Furthermore, after a time delay to allow the logic circuitry to settle, the <1.25 signal coupled to mode control unit 72 is processed. If the <1.25 were high, discriminator control would be continued. On the other hand, if the <1.25 signal were low, discriminator control would be terminated and phase lock loop control would be initiated.

Unfortunately, the count in prescaler 28 and the residue in dual modulus divider 44 cannot be ignored. Since the offset evaluation is only made when the local oscillator frequency, $f_{LO}$, is near to its desired frequency where almost exactly four complete divide by N cycles occur during each count gate, mathematically, the effect of the count in prescaler 28 and the count residue in dual modulus divider 44 on the offset $\Delta f_{LO}$ may be expressed by the equation:

$$\Delta f_{LO} = [(x_f - x_i) + 64(y_f - y_i) + 64 \times 5 \times (AC - (A-1))]f_R \quad (6)$$

where $x_i$ and $x_f$ are the counts of prescaler 28 at the start of and immediately following, respectively, the COUNT gating pulse;

$y_i$ and $y_f$ are the counts of dual modulus divider 44 at the start of and immediately following, respectively, the COUNT gating pulse;

AC is the added count in dual decade counter 46 immediately following the COUNT gating pulse (00 being the count in dual decade counter 46 at the start of the COUNT gating pulse since dual decade counter 46 has been reset); and (A−1) is the added count value for an offset of zero. It is noted that if the effects of prescaler 28 and dual modulus divider 44 were ignored, i.e., it were assumed that $x_i = x_f$ and $y_i = y_f$, from equation (6) that each change in AC represents a 1.25 MHz change in local oscillator frequency. Further, from expression (6) it is seen that since the value of A−1 is dependent on the frequency band in which the selected channel resides but not on the selected channel, it is necessary to only couple band information, and not channel number information, to offset detector 78.

From equation (6) the maximum ambiguity because of the counts in prescaler 28 and the residue in dual modulus divider 44 may be determined. The worst case change in the count of prescaler 28 between the beginning and end of the COUNT gating pulse is a change of 63 counts since in the VHF band divide by K prescaler is programmed to count from 0 to 63, i.e., divide by a factor of 64. The worst case change in the residue in dual modulus counter 44 between the beginning and end of the COUNT gating pulse is a change of 4 counts since when the counting is stopped dual modulus divider 44 has been programmed to count from 0 to 4, i.e., divide by 5. Therefore, from equation (6), the maximum uncertainty in evaluation of the offset, $\Delta f_{LO}$, of the local oscillator frequency (when the reference frequency, $f_R$, is 3.90625 KHz) is 1.25 MHz − 3.90625 KHz or approximately 1.25 MHz.

Due to the ambiguity of approximately 1.25 MHz discussed above, for any frequency counting sample, a high <1.25 signal indicates that the local oscillator frequency is within ±2.5 MHz of its originally synthesized value. Reduction of the ±2.5 MHz evaluation range to a ±1.25 MHz evaluation range is accomplished by making a number of evaluations rather than just one evaluation. If the local oscillator frequency drifts slightly more than 1.25 MHz from its synthesized value, most evaluations will indicate that the offset is less than 1.25 MHz. However, within a reasonable number of evaluations, at least one evaluation will indicate that the offset is greater than 1.25 MHz. The duration of the time interval controlled by timer 74 of the tuning system is selected so that a sufficient number of evaluations can be made. For the tuning system whose logic implementation is shown in FIGS. 3-7, a predetermined time interval of 100 milliseconds has been found to provide suitable accuracy. As previously mentioned, if for any sample during the 100 millisecond time interval the signal <1.25 goes low, mode control unit 72 will cause step control unit 76 to advance the step state. Furthermore, if the signal <1.25 goes low at any time, mode control unit 72 will return local oscillator control to the phase locked loop.

The number of evaluations required varies in an inverse relationship with the desired accuracy. That is, more evaluations are required to prescisely detect an offset slightly greater than 1.25 MHz than are required to detect an offset much greater than 1.25 MHz. Since each positive transition of the input signal of dual modulus divider 44 represents a 0.25 MHz (i.e., 64 × $f_{REF}$) increment of the local oscillator frequency, $f_{LO}$, the count residue in dual decade divider 44 essentially accounts for the relatively large errors in individual evaluations. To understand the effect of the count residue in dual modulus divider 44 on the precision of the offset measurement process, consider, for example, the situation when there is an actual offset of +1.5 MHz when the selected channel is channel 3 and it is assumed the initial count residue in dual modulus divider 44 is 0 just prior to the first sample. Since dual modulus divider 44 does not count when the COUNT signal goes low and is not reset during the noncounting interval, the final residue at the end of one evaluation or sample is the initial residue at the beginning of the next evaluation. That is, the count residue of dual modulus divider 44 may be accumulated from one evaluation to the next. The effect of the accumulation in the example described above is illustrated by Table 5 below.

TABLE 5

| Sample | Added Count | ÷6/÷5 Residue | <1.25 |
|---|---|---|---|
| 1 | 17 | 1 | High |
| 2 | 17 | 2 | High |
| 3 | 17 | 3 | High |
| 4 | 17 | 4 | High |
| 5 | 18 | 0 | Low |

Table 5 shows that for the first four evaluations the signal <1.25 was high, erroneously indicating that the local oscillator frequency was within 1.25 MHz. However, on the fifth evaluation the accumulation of the count residue in dual modulus divider 44 caused the added count to be 18. As a result (in accordance with Table 4), the signal <1.25 went low, correctly indicating that the local oscillator frequency was greater than 1.25 MHz from its synthesized frequency. Analogous results would be obtained for an offset equal to −1.5 MHz with an initial count residue of 4. Thus, for an offset of 0.25 beyond 1.25 MHz, it takes at most five samples, depending on the count residue, for the signal <1.25 to go high. Since a sample is taken each 512 microseconds, it takes 2.56 milliseconds (well within 100 milliseconds) to detect a ±1.5 MHz offset.

Since each positive transition of the input signal of prescaler 28 represents a 3.90625 KHz (i.e., $f_{REF}$) increment of the local oscillator frequency the count of prescaler 28 essentially accounts for the relatively small errors in individual evaluations. To understand the effect of the count of prescaler 28 on the precision of the offset measurement process, consider, for example, a situation in which the offset was close enough to 1.25 MHz so that the count in prescaler 28 increased by 1 for each sample during the times when dual modulus divider 44 and dual decade counter 46 were counting. (It is to be remembered that prescaler 28 is not gated by the COUNT signal and therefore counts continuously). The maximum count in prescaler 28 is 63. Therefore, it would take a maximum of 320 samples (64 × 5) for the signal <1.25 to go low to indicate that the offset was 1.95 KHz greater than 1.25 MHz. The corresponding time required is 164 milliseconds. At 100 milliseconds therefore, there would be an offset of 1.25320 MHz (i.e., 3.20 KHz greater than 1.25 MHz) which would go undetected. This is an error of only 0.26 percent. However, it is noted that this offset is well within the desired control range (±1.5MHz) of AFT discriminator 66 so that there is little possibility that the system will tune local oscillator 26 to an undesired carrier. Thus, the offset measurement arrangement of the tuning system is capable of great precision within a reasonable time, i.e., approximately 100 milliseconds.

It should be noted that because prescaler 28 continues to count while its output is decoupled from divide by N unit 30 in response to a low COUNT signal, certain narrowly defined offsets could go undetected and the <1.25 could remain high although the offset is greater than 1.25 MHz. The worst case in which this can occur is one in which the count in prescaler 28 can increase or decrease by 32 over one whole cycle of the signal R. These undetected offsets occur in an offset range between 1.25 and 1.375 MHz or −1.25 and −1.375 MHz. However, these offsets should not present a problem because they are well within the desired control range of AFT discriminator 66, i.e., a range of ±1.5 MHz. Furthermore, even if an undesired carrier having a frequency within an offset of 1.375 MHz existed which could be detected and tuned by discriminator 66, because of the transient overshoot associated with discriminator control loop, the frequency of local oscillator 26 would overshoot its final value as the discriminator loop attempted to lock, with the local oscillator 26 frequency having started from a zero offset frequency. As a result, the signal <1.25 would go low for at least one evaluation.

Although in FIG. 1 timer 74 and MATV switch 80 are shown as two separate units separately coupled to mode control unit 72, in FIG. 7 it is seen that they are integrally arranged with respect to one another. As earlier described with reference to lock detector 70, timer 74 contains a retriggerable one-shot multivibrator comprising a cross-coupled type of set-reset (S-R) flip-flop. The reset (R) input of the flip-flop is coupled to the common junction of the series combination of a resistor and a capacitor. The series resistor-capacitor circuit is selectively coupled between a DC voltage source and ground through a single-pole double-throw switch which forms MATV switch 80. The transmission (T) gates are coupled between the common junction of the series resistor-capacitor circuit (i.e., the flip-flop's R input) and ground. The control input of one transmission gate is coupled to the set (S) input of the flip-flop. The control input of the other transmission gate is coupled to the $\overline{Q}$ (reset) output of the flip-flop.

Placing the switch in the MATV position provides a charging path for the capacitor. When mode control unit 72 generates a positive-going TRIGGER TIME pulse, the flip-flop is set and the signal, i.e., TIME, developed at its Q (set) output goes high while the signal developed at its $\overline{Q}$ (reset) output goes low. In response, the transmission gate coupled to the set output is turned off. The second transmission gate, connected to the set input is turned on for the duration of the TRIGGER TIME pulse. Following the pulse the second transmission gate turns off and the capacitor is allowed to charge. When the capacitor is charged to a voltage sufficient to reset the flip-flop, the signal TIME goes low. The predetermined time interval, e.g., 100 milliseconds, is determined by selecting the values of the resistor and the capacitor. The transmission gate coupled to the flip-flop's set input provides a retrigger capability.

When the MATV switch is in the $\overline{\text{MATV}}$ position, the capacitor will never charge and as a result the predetermined time interval will have an infinite duration. Since mode control unit 72 will not initiate discriminator control until the predetermined time interval has ended (see the tuning algorithm shown in FIG. 2), the discriminator mode of local oscillator control is effectively disabled in this manner.

A major portion of the operation of mode control unit 72 has already been described in connection with the descriptions of the other portions of the tuning system. Therefore, the operation of the logic implementation of mode control unit 72 shown in FIG. 7 is defined by the following Boolean expressions representing the relationship between various input and output signals of mode control unit 72 which are coupled from and to other portions of the tuning system.

$$\overline{\text{ILLEGAL}} \cdot (\overline{\text{AFT}} + R/2) = \text{COUNT} \quad (7)$$

Mode Transition + $\overline{\text{LOCK}}$ = TRIGGER TIME (8)

$\overline{\text{AFT}} \cdot V \cdot \overline{\text{TIME}} \cdot 4R \cdot \overline{2R} \cdot R \cdot \overline{R/2}$ = SAFT (9)

AFT $\cdot$ 2R $\cdot$ R $\cdot \overline{R/2}$ = RSDET (10)

AFT $\cdot \overline{\text{TIME}} \cdot \overline{R}$ = INHIBIT STEP (11)

CHANGE = $\overline{\text{INHIBIT STEP}}$ (12)

AFT $\cdot Q_{41} \cdot Q_{42} \cdot \overline{\text{CHAN}}$ = INACMAT (13)

AFT $\cdot \overline{<1.25} \cdot \overline{\text{INHIBIT STEP}} \cdot 4R \cdot \overline{R} \cdot \overline{R/2}$ = ADVST (14)

CHANGE + (AFT $\cdot \overline{<1.25} \cdot$ 2R $\cdot \overline{R} \cdot \overline{R/2}$) = RSAFT (15)

In expressions (7) - (15) above, the symbol ($\cdot$) indicates a logic "and" function and the symbol (+) indicates a logic "or" function. Furthermore, the signals SAFT and RSAFT correspond to setting and resetting, respectively, the discriminator control mode.

A logic implementation of step control unit 76 is shown in FIG. 4. Step control unit 76 includes two programmable D-type flip-flops coupled to sequence through the three step states corresponding to 0, +1 MHz and −1 MHz and then repeat. A change of state occurs on each positive-going transition of the ADVST pulse from mode control unit 72. When the signal CHANGE goes high indicating a change in the selected channel, step control unit 76 is reset to the 0 state. The STZ (STep Zero) output signal is high in the 0 state and low in the +1 and −1 states. The STM (STep Minus) output signal is high in the −1 state and low in the +1 and 0 states.

Figure 12:
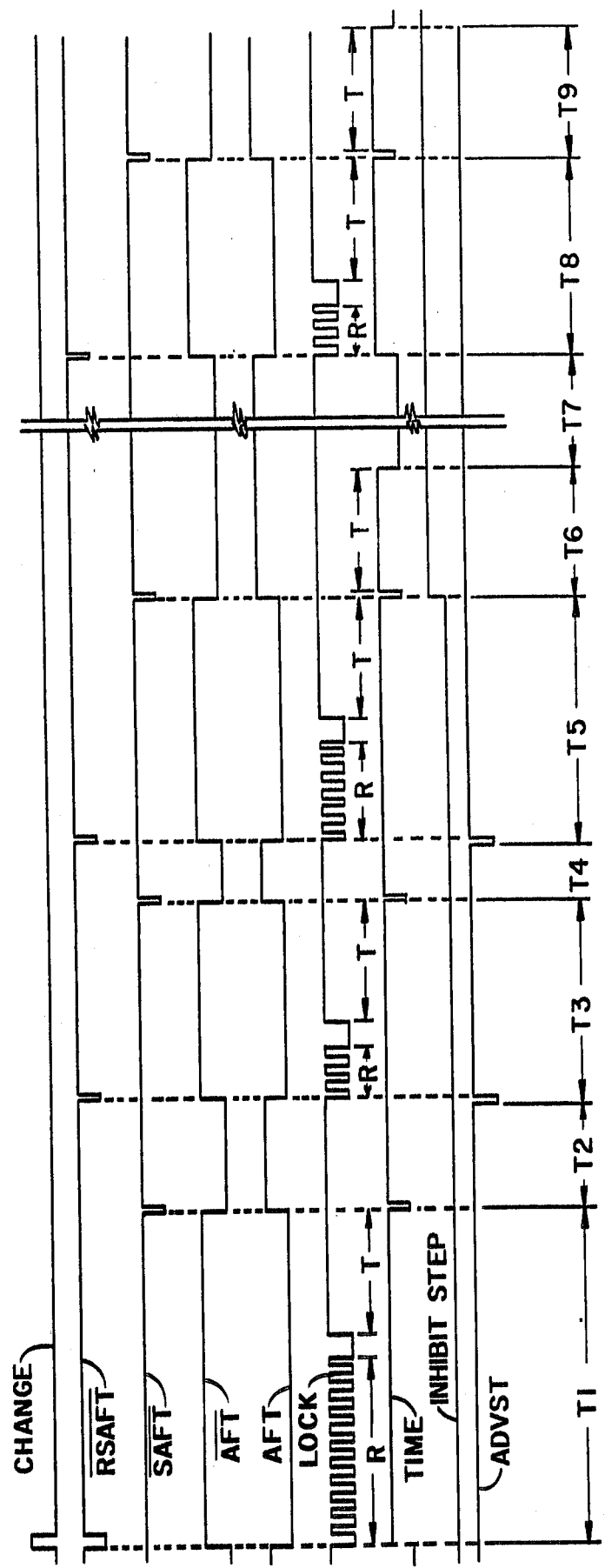

FIG. 12 shows various timing relationships between several waveforms referred to in the foregoing description and is useful in summarizing the operation of the tuning system which has been described. The waveforms illustrate the condition tuning algorithm where the selected channel has a nonstandard picture carrier at a frequency approximately 2 MHz lower than its associated standard frequency picture carrier.

The time period T1 illustrates the interval in which the nominal local oscillator frequency for a newly selected channel is synthesized by the phase locked loop (i.e., $\overline{\text{AFT}}$ is high). The time period T2 illustrates an interval in which, after the phase locked loop configuration is locked, the local oscillator frequency drifts away from its synthesized value because a carrier does not lie within ±1 MHz 45.75 MHz. Time period T3 illustrates the interval in which, the offset, having exceeded 1.25 MHz, a $\overline{\text{RSAFT}}$ signal (ReSet AFT) is generated causing the reinitiation of phase locked loop control and an ADVST signal is generated causing the local oscillator frequency to be synthesized at a frequency 1 MHz higher than its nominal value during the time period T1. The time period T4 illustrates an interval in which, after the phase locked loop has achieved lock with an incremented local oscillator frequency, the local oscillator frequency drifts away from its synthesized value again because no carrier lies within ±MHz of 45.75 MHz. The time period T5 illustrates the interval in which the local oscillator, again having exceeded an offset of 1.25 MHz, mode control unit 72 generates a $\overline{\text{RSAFT}}$ signal to reinitiate phase locked loop control and an ADVST signal to cause the local oscillator frequency to be synthesized at a value 1 MHz less than its nominal value. The time period T6 illustrates an interval in which the local oscillator signal, having been decremented by 1 MHz, causes a picture carrier to fall within the predetermined offset range of 1.25 MHz with the result that discriminator 66 tunes local oscillator 26 to it. The time interval T7 illustrates the expiration of the predetermined time interval (e.g., 100 milliseconds) while local oscillator 26 is under discriminator control causing the generation of an INHIBIT STEP. The time period T8 illustrates a time interval in which there is a momentary signal drop-out causing discriminator control to be terminated and phase locked loop to be reinitiated at the same local oscillator frequency as was synthesized in time period T5. The time period T9 illustrates an interval following a momentary drop-out in which the phase locked loop again becomes locked and discriminator control is again reinitiated. Since by time period T9, the signal has reappeared, local oscillator 26 will again be tuned as in intervals T6 and T7. If the signal has not reappeared, the tuning system will operate as in intervals T8 and T9 until the signal reappears. In FIG. 12 the interval R illustrates the interval during which the one-shot multivibrator of timer 74 is frequently retriggered by the LOCK signal. The interval T, e.g., 100 milliseconds, corresponds to the predetermined time interval which is triggered by the signals $\overline{\text{SAFT}}$ (Set AFT), the signal $\overline{\text{RSAFT}}$ or the signal $\overline{\text{LOCK}}$.

While the offset evaluation arrangement described above takes a number of samples to reduce any ambiguity because of the counts in prescaler 28 and the count residue in direct modulus divider 44, it is noted that the ambiguity of the offset evaluation may be alternatively reduced by detecting the count in prescaler 28 and the count residue in dual modulus divider 44. Furthermore, the ambiguity in the evaluation may be reduced by resetting prescaler 28 and dual modulus divider 44 at the beginning of the COUNT signal. These and other modifications to the offset evaluation arrangement are contemplated to be within the scope of the present invention. However, the arrangement described may be desirable to these alternative approaches because the samples required to provide the desired accuracy are readily taken by the described arrangement without the need of additional circuitry which would be needed for the alternative approaches.

What is claimed is:

1. In a system for tuning a television receiver to the various channels a viewer may select, apparatus comprising:
    local oscillator means for generating a local oscillator signal;
    counter means for generating a frequency divided signal by counting a predetermined number of periods of said local oscillator signal, said predetermined number being proportional to the frequency of said local oscillator signal;
    means for generating a reference frequency signal;
    phase control means for generating a control signal representing the phase and frequency deviation between said frequency divided signal and said reference frequency signal;
    mode switching means for selectively coupling said control signal to said local oscillator means; said mode switching means initially coupling said control signal to said local oscillator means;
    said local oscillator means changing the frequency of said local oscillator signal in response to said control signal until said frequency divided signal and said reference frequency signal to be in a predetermined phase and frequency relation;
    said counter means accumulating a nominal number of counts during a predetermined portion of said frequency divided signal when said frequency divided signal and said reference signal are in said predetermined phase and frequency relationship;
    means for generating a lock signal when said frequency divided signal and said reference frequency signal are in said predetermined phase and frequency relationship;
    said mode switching means decoupling said control signal from said local oscillator means in response to said lock signal;
    means for generating a count signal when said control signal is decoupled from said local oscillator means, said count signal having a duration with a predetermined time relationship to said reference frequency signal;
    means responsive to said count signal for disabling said counter means from counting when said control signal is decoupled from said local oscillator means except during the duration of said count signal; and
    means for generating an offset signal representing the deviation between the count accumulated by said counter means during a time interval corresponding to said predetermined portion of said frequency divided signal when said control signal is decoupled from said local oscillator means and said nominal number of counts, said offset signal being coupled to said mode switching means to control the coupling of said control signal to said local oscillator means.

2. The apparatus recited in claim 1 wherein said means for generating said offset signal includes:
    memory means for generating an output signal having a first amplitude when said memory means is set and a second amplitude when said memory means is reset, said output signal being coupled to said mode switching means as said offset signal;
    means for resetting said memory means prior to the occurrence of said time interval corresponding to said predetermined portion of said frequency divided signal when said control signal is decoupled from said local oscillator means;
    means for setting said memory means if the count accumulated by said counter during said time interval corresponding to said predetermined portion of said frequency divided signal when said control signal is decoupled from said local oscillator means is less than said nominal number of counts by a first predetermined deviation; and
    means for resetting said memory means if the count accumulated by said counter means during said time interval corresponding to said predetermined portion of said frequency divided signal when said control signal is decoupled from said local oscillator means is greater than said nominal number of counts by a second predetermined deviation.

3. The apparatus recited in claim 1 wherein said counter means derives said frequency divided signal by counting a first number of periods during a first portion of said frequency divided signal and by counting a second number of periods during a second portion of said frequency divided signal.

4. The apparatus recited in claim 3 wherein the various channels a viewer may select are partitioned into frequency bands, said first number is related to the channel selected by a viewer and said second number is related to the frequency band in which the selected channel resides.

5. The apparatus recited in claim 4 wherein said predetermined portion is at least a part of said second portion.

6. The apparatus recited in claim 5 wherein said counter includes:
    variable modulus frequency divider means for selectively dividing the frequency of said local oscillator signal by a first factor or a second factor, said first factor being related to the frequency spacing between channels in at least one of said bands;
    decade counter means for counting periods of the output signal of said variable modulus frequency divider;

channel number comparator means for generating a channel match signal when the number of periods counted by said decade counter means equals said first number, said decade counter means being reset in response to said channel match signal;

first factor stop comparator means for generating a first factor stop signal when the number of periods counted by said decade counter means equals a third number, said third number being also related to the band in which the selected channel resides but less than said second number, said variable modulus divider means being caused to divide by said second factor in response to said first factor stop signal; and added count comparator means for generating an added count match signal when the number of periods counted by said decade counter means equals said second number, said decade counter means being reset in response to said added count match signal, said variable modulus divider means being caused to divide by said first factor in response to said added count match signal.

7. The apparatus recited in claim 6 wherein said nominal number of counts equals said second number.

8. The apparatus recited in claim 7 wherein said means for generating said offset signal includes means for resetting at least said decade counter means and for causing said variable modulus divider to divide by said first factor in response to the initiation of said count signal.

9. The apparatus recited in claim 7 wherein said means for generating said offset signal includes:

memory means for generating an output signal when said memory means is set and a second amplitude when said memory means is reset, said output signal being coupled to said mode switching means as said offset signal;

means for resetting said memory means prior to the occurrence of said first factor stop signal during the duration of said count signal when said control signal is decoupled from said local oscillator;

means for inhibiting the generation of said added count signal when said control signal is decoupled from said local oscillator;

means for setting said memory means if the count accumulated by said counter means after said first factor stop signal when said control signal is decoupled from said local oscillator means is less than said second number by a first predetermined deviation; and means for resetting said memory means if the count accumulated by said counter means after said first factor stop signal when said control signal is decoupled from said local oscillator means is greater than said second number by a second predetermined deviation.

10. The apparatus recited in claim 9 wherein said means for generating said offset signal includes means for repetitively generating said offset signal.

11. The apparatus recited in claim 1 wherein said means for disabling said counter means includes input switching means for selectively decoupling said local oscillator signal from said counter means when said control signal is decoupled from said local oscillator means except in response to said count signal; and said counter means includes means for generating an illegal signal when an illegal channel has been selected;

said input switching means also decoupling said local oscillator signal from said counter means in response to said illegal signal.

12. The apparatus recited in claim 11 wherein:

said means for generating said illegal signal includes band selection means for generating a band traversed signal whenever the count accumulated by said counter corresponds to the boundary of a band and means for generating a band signal representing the band in which the selected channel resides in accordance with which of said band traversed signals have been generated during said first portion of said frequency divided signal, said means for generating a band signal generating said illegal signal when a band signal is not generated.

13. The apparatus recited in claim 11 wherein said means for generating said reference frequency also includes means for deriving a signal having a predetermined frequency; and said input means includes means for coupling said signal having a predetermined frequency to said counter means in response to said illegal signal.

* * * * *

UNITED STATES PATENT AND TRADEMARK OFFICE
CERTIFICATE OF CORRECTION

PATENT NO. : 4,109,283

DATED : August 22, 1978

INVENTOR(S) : Robert Morgan Rast

It is certified that error appears in the above-identified patent and that said Letters Patent is hereby corrected as shown below:

Column 1, line 12, that portion reading "tuning device system" should read -- tuning system --; line 14, that portion reading "oscilator" (first occurrence) should read -- oscillator --; line 58, that portion reading "potions" should read -- portions --; line 61, that portion reading "Serial No. 663,097" should read -- Serial No. 662,097 --; Column 2, line 7, that portion reading "including" should read -- indicating --; Column 3, line 19, that portion reading "decector" should read -- detector --; line 23, that portion reading "second" should read -- sound --; Column 5, line 48, that portion reading "tubing" should read -- tuning --; line 53, that portion reading "1.25" should read -- $\overline{<1.25}$ --; line 54, that portion reading "AFT" should read -- $\overline{AFT}$ --; Column 6, lines 1, 4, 6, 24, 33 and 57, those portions reading "<1.25" should read -- $\overline{<1.25}$ --; Column 8, line 20, that portion reading "52" should read -- 42 --; Column 10, line 63, that portion reading "4,009,459" should read -- 4,009,439 --; line 68, that portion reading "Q" should read -- $\overline{Q}$ --; Column 12, line 3, that portion reading "U" (second occurrence) should read -- $\overline{U}$ --; Column 13, line 4, that portion reading "in" should read -- is --; line 56, that portion reading "counter counter" should read -- counter --; line 64, that portion reading "comarator" should read -- comparator --; Column 15, line 18, that portion reading "from mode" should be deleted; line 25, that portion reading "CHAN" should read -- $\overline{CHAN}$ --; Column 16, line 16,

UNITED STATES PATENT AND TRADEMARK OFFICE
CERTIFICATE OF CORRECTION

PATENT NO. : 4,109,283

DATED : August 22, 1978

INVENTOR(S) : Robert Morgan Rast

It is certified that error appears in the above-identified patent and that said Letters Patent is hereby corrected as shown below:

that portion reading "REF/R" should be deleted; Column 17, line 3, that portion reading "RSDET" should read -- $\overline{RSDET}$ --.

Signed and Sealed this

Nineteenth Day of June 1979

[SEAL]

*Attest:*

RUTH C. MASON
*Attesting Officer*

DONALD W. BANNER
*Commissioner of Patents and Trademarks*